(12) United States Patent
Shi et al.

(10) Patent No.: US 12,278,209 B2
(45) Date of Patent: Apr. 15, 2025

(54) PERIPHERAL CIRCUIT HAVING RECESS GATE TRANSISTORS AND METHOD FOR FORMING THE SAME

(71) Applicant: YANGTZE MEMORY TECHNOLOGIES CO., LTD., Wuhan (CN)

(72) Inventors: Yanwei Shi, Wuhan (CN); Yanhong Wang, Wuhan (CN); Cheng Gan, Wuhan (CN); Liang Chen, Wuhan (CN); Wei Liu, Wuhan (CN); Zhiliang Xia, Wuhan (CN); Wenxi Zhou, Wuhan (CN); Kun Zhang, Wuhan (CN); Yuancheng Yang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 685 days.

(21) Appl. No.: 17/510,779

(22) Filed: Oct. 26, 2021

(65) Prior Publication Data
US 2023/0005875 A1    Jan. 5, 2023

Related U.S. Application Data

(63) Continuation of application No. PCT/CN2021/103560, filed on Jun. 30, 2021.

(51) Int. Cl.
*H01L 25/065* (2023.01)
*G11C 16/04* (2006.01)
(Continued)

(52) U.S. Cl.
CPC .......... *H01L 24/80* (2013.01); *G11C 16/0483* (2013.01); *G11C 16/24* (2013.01);
(Continued)

(58) Field of Classification Search
CPC ..... H01L 24/80; H01L 24/08; H01L 25/0657; H01L 25/18; H01L 25/50;
(Continued)

(56) References Cited

U.S. PATENT DOCUMENTS 10,141,326 B1    11/2018   Oh et al.
10,868,162 B1    12/2020   Wong et al.
(Continued)

FOREIGN PATENT DOCUMENTS

CN    1577802 A    2/2005
CN    1893086 A    1/2007
(Continued)

OTHER PUBLICATIONS

International Search Report issued in corresponding International Application No. PCT/CN2021/103603, mailed Mar. 28, 2022, 5 pages.
(Continued)

*Primary Examiner* — Thanh Y. Tran
(74) *Attorney, Agent, or Firm* — BAYES PLLC

(57) ABSTRACT

In certain aspects, a method for forming a three-dimensional (3D) memory device is disclosed. A first semiconductor structure including an array of NAND memory strings is formed on a first substrate. A second semiconductor structure including a recess gate transistor is formed on a second substrate. The recess gate transistor includes a recess gate structure protruding into the second substrate. The first semiconductor structure and the second semiconductor structure are bonded in a face-to-face manner, such that the array of NAND memory strings is coupled to the recess gate transistor across a bonding interface.

20 Claims, 23 Drawing Sheets

(51) Int. Cl.
  *G11C 16/24* (2006.01)
  *H01L 23/00* (2006.01)
  *H01L 25/00* (2006.01)
  *H01L 25/18* (2023.01)
  *H10B 41/41* (2023.01)
  *H10B 43/40* (2023.01)

(52) U.S. Cl.
  CPC .......... *H01L 24/08* (2013.01); *H01L 25/0657* (2013.01); *H01L 25/18* (2013.01); *H01L 25/50* (2013.01); *H10B 41/41* (2023.02); *H10B 43/40* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
  CPC . H01L 2224/08145; H01L 2224/80895; H01L 2224/80896; H01L 2924/1431; H01L 2924/14511; H10B 41/41; H10B 43/40
  See application file for complete search history.

(56) References Cited

U.S. PATENT DOCUMENTS

| | | |
|---|---|---|
| 2014/0187031 A1 | 7/2014 | Sung |
| 2014/0239407 A1 | 8/2014 | Manabe et al. |
| 2016/0056171 A1 | 2/2016 | Manorotkul et al. |
| 2018/0197988 A1 | 7/2018 | Ratnam et al. |
| 2020/0350322 A1 | 11/2020 | Liu et al. |
| 2020/0350330 A1 | 11/2020 | Ahn et al. |
| 2021/0134778 A1* | 5/2021 | Huang .................. H10B 43/27 |
| 2022/0085048 A1* | 3/2022 | Lee ........................ H10B 43/40 |

FOREIGN PATENT DOCUMENTS

| | | |
|---|---|---|
| CN | 1956170 A | 5/2007 |
| CN | 104681557 A | 6/2015 |
| CN | 105609470 A | 5/2016 |
| CN | 109427814 A | 3/2019 |
| CN | 110192269 A | 8/2019 |
| CN | 110546762 A | 12/2019 |
| CN | 110914987 A | 3/2020 |
| CN | 112864162 A | 5/2021 |
| DE | 102017127209 A1 | 1/2019 |
| TW | 202021094 A | 6/2020 |
| WO | 2021003635 A1 | 1/2021 |

OTHER PUBLICATIONS

International Search Report issued in corresponding International Application No. PCT/CN2021/103560, mailed Mar. 29, 2022, 4 pages.

* cited by examiner

100

101 flat gate transistor recess gate transistor

1200

PERIPHERAL CIRCUIT HAVING RECESS GATE TRANSISTORS AND METHOD FOR FORMING THE SAME

CROSS-REFERENCE TO RELATED APPLICATIONS

This application is continuation of International Application No. PCT/CN2021/103560, filed on Jun. 30, 2021, entitled "PERIPHERAL CIRCUIT HAVING RECESS GATE TRANSISTORS AND METHOD FOR FORMING THE SAME," which is hereby incorporated by reference in its entirety. This application is also related to co-pending U.S. application Ser. No. 17/510,752, filed on Oct. 26, 2021, entitled "PERIPHERAL CIRCUIT HAVING RECESS GATE TRANSISTORS AND METHOD FOR FORMING THE SAME," which is hereby incorporated by reference in its entirety.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a method for forming a 3D memory device is disclosed. A first semiconductor structure including an array of NAND memory strings is formed on a first substrate. A second semiconductor structure including a recess gate transistor is formed on a second substrate. The recess gate transistor includes a recess gate structure protruding into the second substrate. The first semiconductor structure and the second semiconductor structure are bonded in a face-to-face manner, such that the array of NAND memory strings is coupled to the recess gate transistor across a bonding interface.

In another aspect, a method for forming a semiconductor device is disclosed. A recess is formed in a substrate. A first gate dielectric is formed on a sidewall and a bottom surface of the recess and a second gate dielectric on the substrate. A first gate electrode is formed on the first gate dielectric and a second gate electrode on the second gate dielectric.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
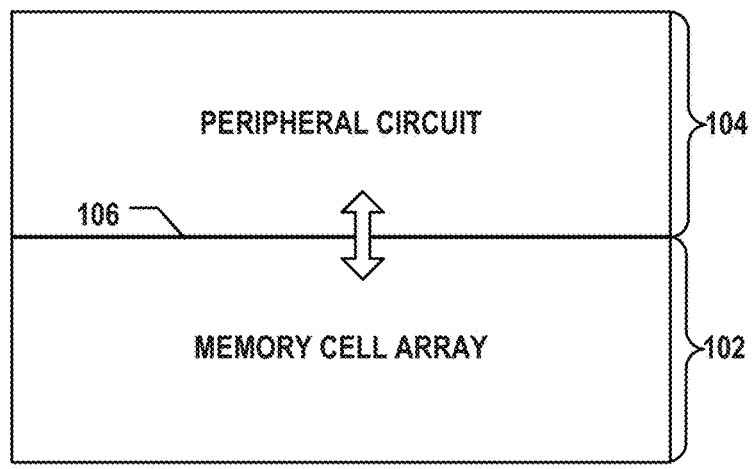
FIG. 1A illustrates a schematic view of a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

With the development of 3D memory devices, such as 3D NAND Flash memory device, the more stacked layers (e.g., word lines) require more peripheral circuits for operating the 3D memory devices. In particular, the number and/or size of page buffers need to increase to match the increased number of memory cells. In some cases, the chip area occupied by page buffers can become dominating in a 3D NAND Flash memory, for example, more than 50% of the total chip area. Moreover, in some 3D memory devices in which the memory cell array and peripheral circuits are fabricated on different substrates and bonded together, the continuous increase of peripheral circuits' areas, particularly page buffers' area, makes it the bottleneck for reducing the total chip size.

One way to reduce the size of the peripheral circuits is to shrink the transistor area by gate width and length shrinkage, which, however, can cause channel leakage degradation, thereby limiting the device area shrinkage percentage. Thus, the reduction of the peripheral circuits in 3D memory devices without sacrificing much performance has become more and more challenging.

To address the aforementioned issues, the present disclosure introduces a solution in which the recess gate transistors replace the flat gate transistors in forming some of the peripheral circuits in a memory device, such as a 3D NAND Flash memory device. That is, the peripheral circuits can have a mixed type of transistors (both recess gate transistors and flat gate transistors), which can balance the device size shrinkage and the performance degradation. Consistent with the scope of the present disclosure, in some implementations, the page buffer, the dominating factor of chip size, has recess gate transistors instead of flat gate transistors in order to shrink the device size while maintaining the comparable or even better device leakage performance. The peripheral circuits other than the page buffer can still use flat gate transistors, which can reduce the fabrication complexity and device structure and performance variations compared to using recess gate transistors.

FIG. 1A illustrates a schematic view of a cross-section of an exemplary 3D memory device 100, according to some aspects of the present disclosure. 3D memory device 100 represents an example of a bonded chip. The components of 3D memory device 100 (e.g., memory cell array and peripheral circuits) can be formed separately on different substrates and then jointed to form a bonded chip. 3D memory device 100 can include a first semiconductor structure 102 including an array of memory cells (memory cell array). In some implementations, the memory cell array includes an array of NAND Flash memory cells. For ease of description, a NAND Flash memory cell array may be used as an example for describing the memory cell array in the present disclosure. But it is understood that the memory cell array is not limited to NAND Flash memory cell array and may include any other suitable types of memory cell arrays, such as NOR Flash memory cell array, phase change memory (PCM) cell array, resistive memory cell array, magnetic memory cell array, spin transfer torque (STT) memory cell array, to name a few.

First semiconductor structure 102 can be a NAND Flash memory device in which memory cells are provided in the form of an array of 3D NAND memory strings and/or an array of two-dimensional (2D) NAND memory cells. NAND memory cells can be organized into pages, which are then organized into blocks in which each NAND memory cell is electrically connected to a separate line called a bit line (BL). All cells with the same vertical position in the NAND memory cell can be electrically connected through the control gates by a word line (WL). In some implementations, a plane contains a certain number of blocks that are electrically connected through the same bit line. First semiconductor structure 102 can include one or more planes, and the peripheral circuits that are needed to perform all the read/write/erase operations can be included in a second semiconductor structure 104.

In some implementations, the array of NAND memory cells is an array of 2D NAND memory cells, each of which includes a floating-gate transistor. The array of 2D NAND memory cells include a plurality of 2D NAND memory strings, each of which includes a plurality of memory cells (e.g., 32 to 128 memory cells) connected in series (resembling a NAND gate) and two select transistors, according to some implementations. Each 2D NAND memory string is arranged in the same plane on the substrate (in 2D), according to some implementations. In some implementations, the array of NAND memory cells is an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor.

As shown in FIG. 1A, 3D memory device 100 can also include second semiconductor structure 104 including the peripheral circuits of the memory cell array of first semiconductor structure 102. The peripheral circuits (also known as control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some implementations, the peripheral circuits in second semiconductor structure 104 use metal-oxide-semiconductor (MOS) technology, e.g., which can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.) to achieve high speed. It is understood that in some examples, other processing units (also known as "logic circuits") besides the peripheral circuits may be formed in second semiconductor structure 104 as well, such as a memory controller or a processor. It is further understood that second semiconductor structure 104 may also include other memory devices that are compatible with the fabrication process of the logic circuits (e.g., using MOS technology), such as static random-access memory (SRAM) and dynamic random-access memory (DRM).

As shown in FIG. 1A, 3D memory device 100 further includes a bonding interface 106 vertically between first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed input/output (I/O) throughput with reduced power consumption. Data transfer between the memory cell array in first semiconductor structure 102 and the peripheral circuits in second semiconductor structure 104 can be performed through the interconnects (e.g., bonding contacts) across bonding interface 106. By vertically integrating first and second semiconductor structures 102 and 104, the chip size can be reduced, and the memory cell density can be increased. Furthermore, as a "unified" chip, by integrating multiple discrete chips (e.g., various processors, controllers, and memories) into a single bonded chip (e.g., 3D memory device 100), faster system speed and smaller PCB size can be achieved as well.

Figure 1B:
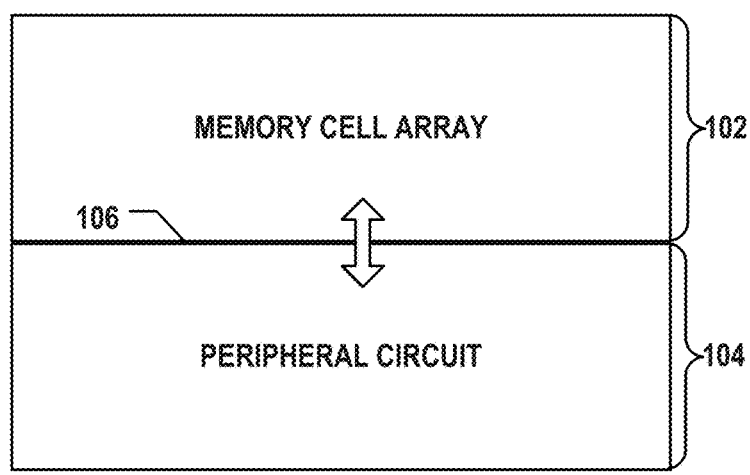
FIG. 1B illustrates a schematic view of a cross-section of another exemplary 3D memory device, according to some aspects of the present disclosure.

It is understood that the relative positions of stacked first and second semiconductor structures 102 and 104 are not limited. FIG. 1B illustrates a schematic view of a cross-section of another exemplary 3D memory device 101, according to some implementations. Different from 3D memory device 100 in FIG. 1A in which second semiconductor structure 104 including the peripheral circuits is above first semiconductor structure 102 including the memory cell array, in 3D memory device 101 in FIG. 1B, first semiconductor structure 102 including the memory cell array is above second semiconductor structure 104 including the peripheral circuits. Nevertheless, bonding interface 106 is formed vertically between first and second semiconductor structures 102 and 104 in 3D memory device 101, and first and second semiconductor structures 102 and 104 are jointed vertically through bonding (e.g., hybrid bonding) according to some implementations. Data transfer between the memory cell array in first semiconductor structure 102 and the peripheral circuits in second semiconductor structure 104 can be performed through the interconnects (e.g., bonding contacts) across bonding interface 106.

Figure 2:
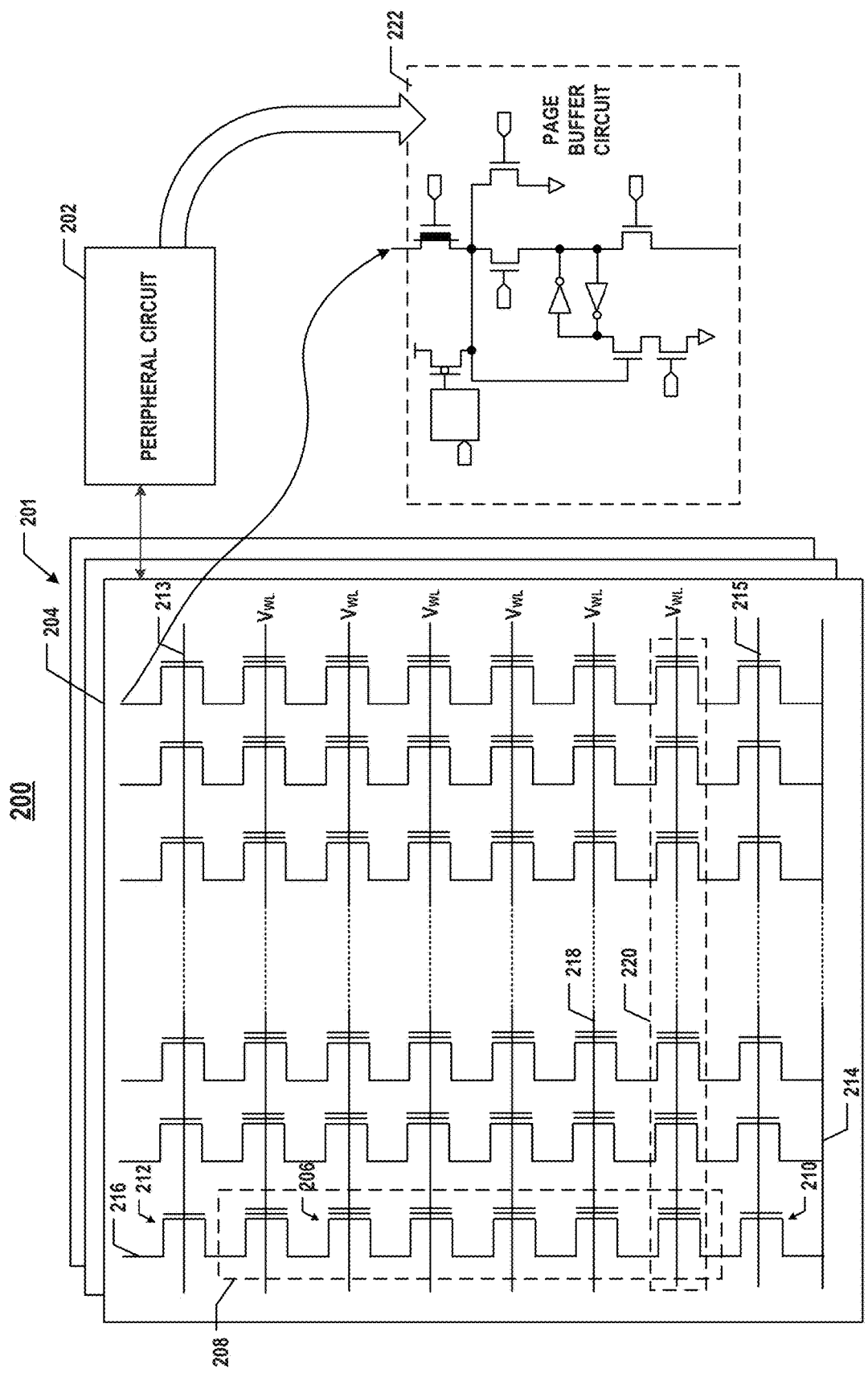
FIG. 2 illustrates a schematic circuit diagram of an exemplary memory device including peripheral circuits having a page buffer, according to some aspects of the present disclosure.

FIG. 2 illustrates a schematic circuit diagram of an exemplary memory device 200 including peripheral circuits having a page buffer, according to some aspects of the present disclosure. Memory device 200 can include a memory cell array 201 and peripheral circuits 202 coupled to memory cell array 201. 3D memory devices 100 and 101 may be examples of memory device 200 in which memory cell array 201 and peripheral circuits 202 may be included in first and second semiconductor structures 102 and 104, respectively. Memory cell array 201 can be a NAND Flash memory cell array in which memory cells 206 are provided in the form of an array of NAND memory strings 208 each extending vertically above a substrate (not shown). In some implementations, each NAND memory string 208 includes a plurality of memory cells 206 coupled in series and stacked vertically. Each memory cell 206 can hold a continuous, analog value, such as an electrical voltage or charge, that depends on the number of electrons trapped within a region of memory cell 206. Each memory cell 206 can be either a floating gate type of memory cell including a floating-gate transistor or a charge trap type of memory cell including a charge-trap transistor.

In some implementations, each memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 206 is a multi-level cell (MLC) that is capable of storing more than a single bit of data in more than four memory states. For example, the MLC can store two bits per cell, three bits per cell (also known as triple-level cell (TLC)), or four bits per cell (also known as quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each NAND memory string 208 can include a source select gate (SSG) 210 at its source end and a drain select gate (DSG) 212 at its drain end. SSG 210 and DSG 212 can be configured to activate selected NAND memory strings 208 (columns of the array) during read and program operations. In some implementations, SSGs 210 of NAND memory strings 208 in the same block 204 are coupled through a same source line (SL) 214, e.g., a common SL, for example, to the ground. DSG 212 of each NAND memory string 208 is coupled to a respective bit line 216 from which data can be read via an output bus (not shown), according to some implementations. In some implementations, each NAND memory string 208 is configured to be selected or deselected by applying a select voltage (e.g., above the threshold voltage of the transistor having DSG 212) or a deselect voltage (e.g., 0 V) to respective DSG 212 through one or more DSG lines 213 and/or by applying a select voltage (e.g., above the threshold voltage of the transistor having SSG 210) or a deselect voltage (e.g., 0 V) to respective SSG 210 through one or more SSG lines 215.

As shown in FIG. 2, NAND memory strings 208 can be organized into multiple blocks 204, each of which can have a common source line 214. In some implementations, each block 204 is the basic data unit for erase operations, i.e., all memory cells 206 on the same block 204 are erased at the same time. Memory cells 206 of adjacent NAND memory strings 208 can be coupled through word lines 218 that select which row of memory cells 206 is affected by read and program operations. In some implementations, each word line 218 is coupled to a page 220 of memory cells 206, which is the basic data unit for program operations. The size of one page 220 in bits can correspond to the number of NAND memory strings 208 coupled by word line 218 in one block 204. Each word line 218 can include a plurality of control gates (gate electrodes) at each memory cell 206 in respective page 220 and a gate line coupling the control gates.

Figure 3:
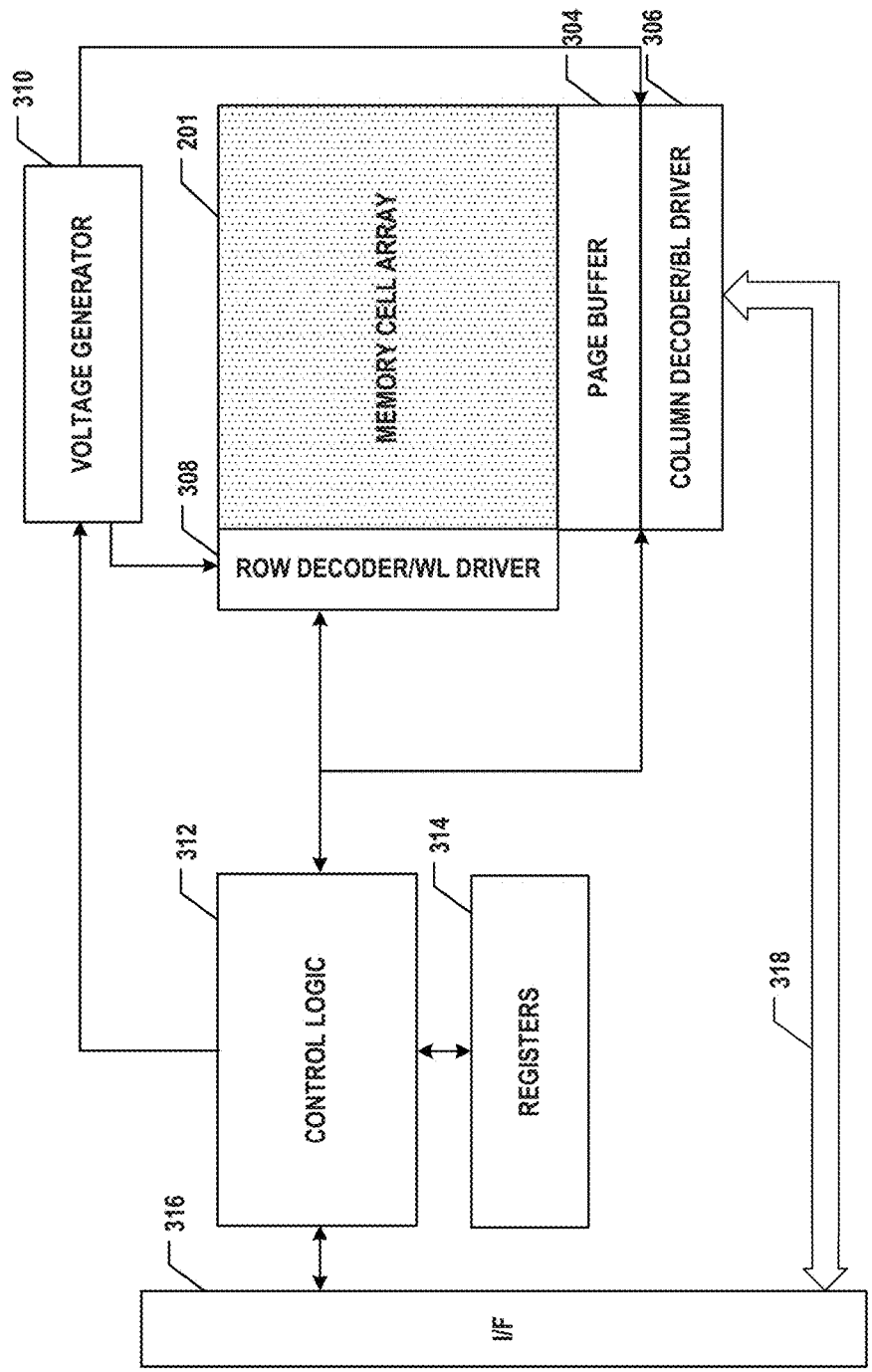
FIG. 3 illustrates a block diagram of an exemplary memory device including a memory cell array and peripheral circuits, according to some aspects of the present disclosure.

Peripheral circuits 202 can be coupled to memory cell array 201 through bit lines 216, word lines 218, source lines 214, SSG lines 215, and DSG lines 213. As described above, peripheral circuits 202 can include any suitable circuits for facilitating the operations of memory cell array 201 by applying and sensing voltage signals and/or current signals through bit lines 216 to and from each target memory cell 206 through word lines 218, source lines 214, SSG lines 215, and DSG lines 213. Peripheral circuits 202 can include various types of peripheral circuits formed using MOS technologies. For example, FIG. 3 illustrates some exemplary peripheral circuits 202 including a page buffer 304, a column decoder/bit line driver 306, a row decoder/word line driver 308, a voltage generator 310, control logic 312, registers 314, an interface (I/F) 316, and a data bus 318. It is understood that in some examples, additional peripheral circuits 202 may be included as well.

Page buffer 304 can be configured to read and program data from and to memory cell array 201 according to the control of control logic 312. In one example, page buffer 304 may store one page of program data (write data) to be programmed into one page 220 of memory cell array 201. In another example, page buffer 304 also performs program verify operations to ensure that the data has been properly programmed into memory cells 206 coupled to selected word lines 218. In some implementations as shown in FIG. 2, page buffer 304 includes a plurality of page buffer circuits 222 each coupled to one NAND memory string 208 via a respective bit line 216. That is, memory device 200 can include bit lines 216 respectively coupled to NAND memory strings 208, and page buffer 304 can include page buffer circuits 222 respectively coupled to bit lines 216 and NAND memory strings 208. Each page buffer circuit 222 can include one or more latches, switches, supplies, nodes (e.g., data nodes and I/O nodes), current mirrors, verify logic, sense circuits, etc. In some implementations, each page buffer circuit 222 is configured to store sensing data corresponding to read data, which is received from a respective bit line 216, and output the stored sensing data to at the time of the read operation; each page buffer circuit 222 is also configured to store program data and output the stored program data to a respective bit line 216 at the time of the program operation.

Row decoder/word line driver 308 can be configured to be controlled by control logic 312 and select block 204 of memory cell array 201 and a word line 218 of selected block 204. Row decoder/word line driver 308 can be further configured to drive the selected word line 218 using a word line voltage generated from voltage generator 310. Voltage generator 310 can be configured to be controlled by control logic 312 and generate the word line voltages (e.g., read voltage, program voltage, pass voltage, local voltage, and verification voltage) to be supplied to memory cell array 201. Column decoder/bit line driver 306 can be configured to be controlled by control logic 312 and select one or more NAND memory strings 208 by applying bit line voltages generated from voltage generator 310. For example, column decoder/bit line driver 306 may apply column signals for selecting a set of N bits of data from page buffer 304 to be outputted in a read operation.

Control logic 312 can be coupled to each peripheral circuit 202 and configured to control operations of peripheral circuits 202. Registers 314 can be coupled to control logic 312 and include status registers, command registers, and address registers for storing status information, command operation codes (OP codes), and command addresses for controlling the operations of each peripheral circuit 202.

Interface 316 can be coupled to control logic 312 and act as a control buffer to buffer and relay control commands received from a host (not shown) to control logic 312 and status information received from control logic 312 to the host. Interface 316 can also be coupled to page buffer 304 and column decoder/bit line driver 306 via data bus 318 and act as an I/O interface and a data buffer to buffer and relay the program data received from a host (not shown) to page buffer 304 and the read data from page buffer 304 to the host. In some implementations, interface 316 and data bus 318 are part of an I/O circuit of peripheral circuits 202.

Figure 4:
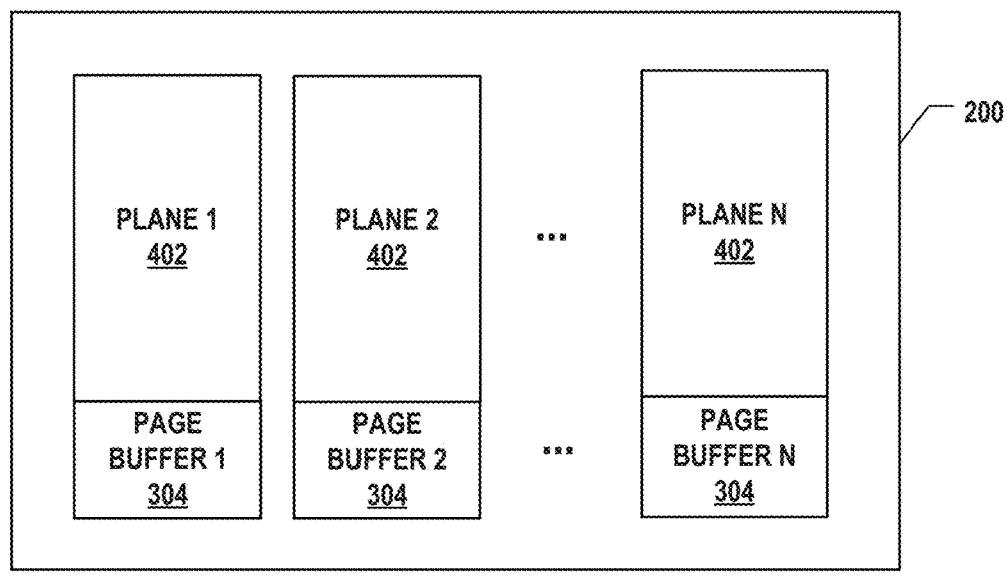
FIG. 4 illustrates a schematic plan view of an exemplary memory device having multiple planes and page buffers, according to some aspects of the present disclosure.

As shown in FIG. 4, in some implementations, memory cell array 201 is arranged in multiple planes 402, each of which has multiple blocks 204 and its own page buffer 304. That is, memory device 200 can include multiple planes 402 of memory cells 206 and multiple page buffers 304 respective coupled to multiple planes 402. Although not shown in FIG. 4, it is understood that in some examples, each plane 402 may have its own set of page buffer 304, row decoder/word line driver 308, and column decoder/bit line driver 306, such that control logic 312 can control the operations of multiple planes 402 in parallel in a synchronous manner or asynchronous manner to increase the operating speed of memory device 200. As described above with respect to FIGS. 2-4, it is understood that the number of page buffers 304, and the number of page buffer circuits 222 in each page buffer may increase as the number of memory cells increase due to the increased numbers of planes 402, blocks 204, NAND memory strings 208, and/or pages 220. Thus, the total area of page buffers 304 keeps increasing if the device size of each transistor forming page buffer circuit 222 does not decrease.

Figure 5:
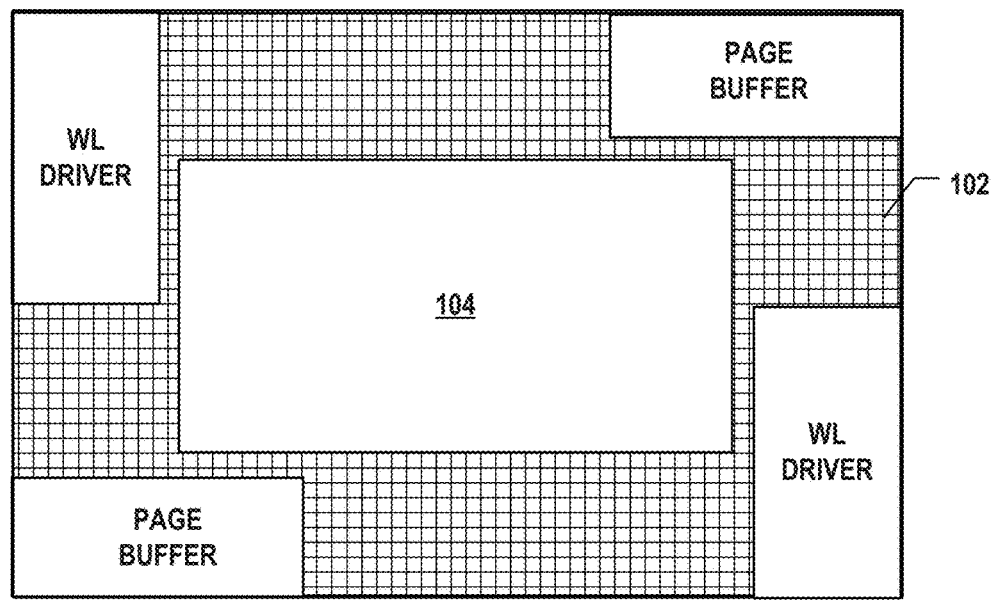
FIG. 5 illustrates a schematic plan view of an exemplary memory device having a memory cell array and peripheral circuits including page buffers, according to some aspects of the present disclosure.

Moreover, in 3D memory device 100 or 101 in which the peripheral circuits and the memory cell array are stacked over one another in a bonded chip, the size of 3D memory device 100 or 101 depends on the larger size of first or second semiconductor structure 102 or 104. As shown in FIG. 5, as the area of page buffers 304 continuously increases, the size of second semiconductor structure 104 having the peripheral circuits may eventually become greater than the size of first semiconductor structure 102 having the memory cell array and thus, dominates the size of 3D memory device 100 or 101. As a result, to compensate for the size increase of memory device 200 (and in particular, 3D memory device 100 or 101), the device size of each transistor forming page buffer circuit 222 needs to decrease without sacrificing much the performance, such as the device leakage permeance, as described above.

Consistent with the scope of the present disclosure, in some implementations, each page buffer 304, the dominating factor of chip size, has recess gate transistors instead of flat gate transistors in order to shrink the device size while maintaining the comparable or even better device leakage performance. Peripheral circuits 202 other than page buffer 304, such as row decoder/word line driver 308, column decoder/bit line driver 306, voltage generator 310, control logic 312, registers 314, data bus 318, and/or interface 316, can still use flat gate transistors, which can reduce the fabrication complexity and device structure and performance variations compared to using recess gate transistors. In some implementations, the I/O circuit (e.g., including interface 316 and data bus 318) uses flat gate transistors because flat gate transistors can provide a higher operation speed than the recess gate transistors, which is a desired feature for the I/O circuit that needs to frequently communicate with external devices. For example, FIG. 6A illustrates a plan view and a side view of cross-sections of an exemplary flat gate transistor, according to some aspects of the present disclosure, and FIG. 6B illustrates a plan view and a side view of cross-sections of an exemplary recess gate transistor, according to some aspects of the present disclosure.

Figure 6A:
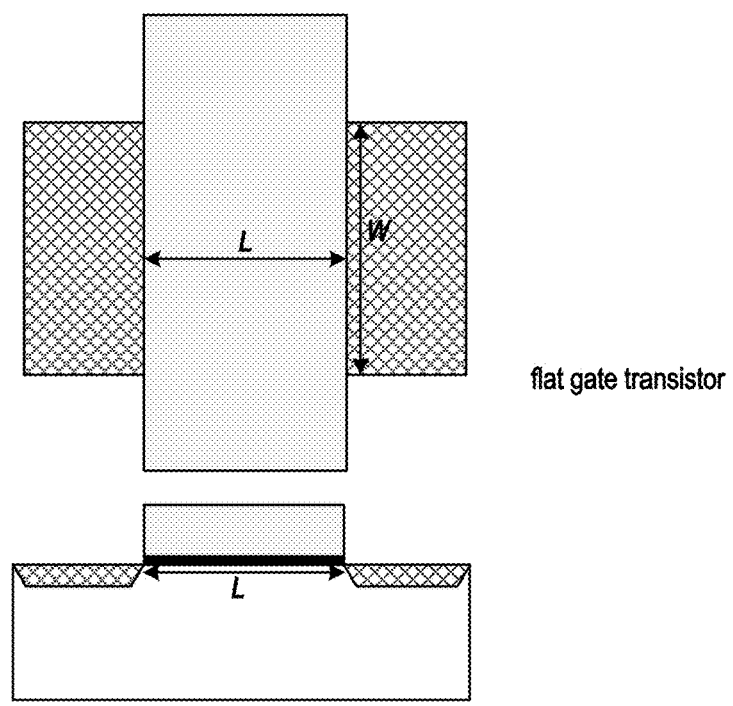
FIG. 6A illustrates a plan view and a side view of cross-sections of an exemplary flat gate transistor, according to some aspects of the present disclosure.
Figure 6B:
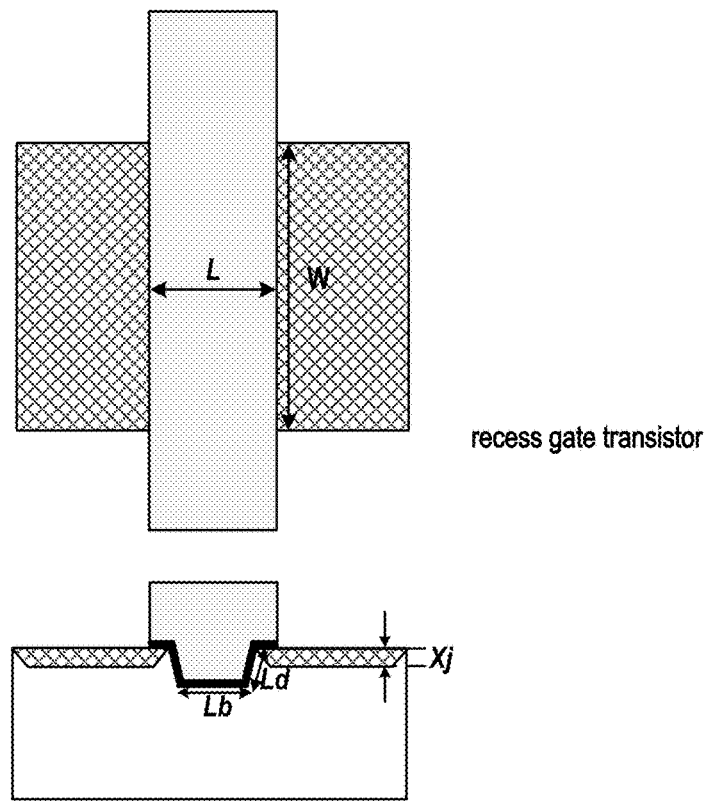
FIG. 6B illustrates a plan view and a side view of cross-sections of an exemplary recess gate transistor, according to some aspects of the present disclosure.

As shown in FIG. 6A, for a flat gate transistor, the effective channel length Leff is the same as the gate length L, whereas in FIG. 6B, for a recess gate transistor, the effective channel length Leff=Lb+2Ld−2xj, where Lb represents the gate length at the bottom of the gate structure protruding into the substrate, Ld represents the depth of the gate structure protruding into the substrate (considering the slope for better accuracy if the slope is not 90 degrees), and xj represents the junction depth of the source/drain. For a flat gate transistor, the reduction of device area can be achieved by reducing the gate length L (and also gate width W in some cases), which in turn reduces the effective channel length. As a result, channel leakage can be degraded. In contrast, for a recess gate transistor, the reduction of the device area (e.g., by reducing the gate length L) may not reduce the effective channel length Leff due to the addition of Ld. Moreover, better gate control can be realized due to the protrusion shape of the recess gate structure. Thus, the device area can be reduced while keeping comparable or even better device leakage performance. On the other hand, the protrusion shape of the recess gate structure in recess gate transistors may also introduce higher fabrication complexity and device variations compared with the flat gat transistors. The structures, functions, and processes of the flat gate transistors and recess gate transistors are described below in detail.

Figure 7:
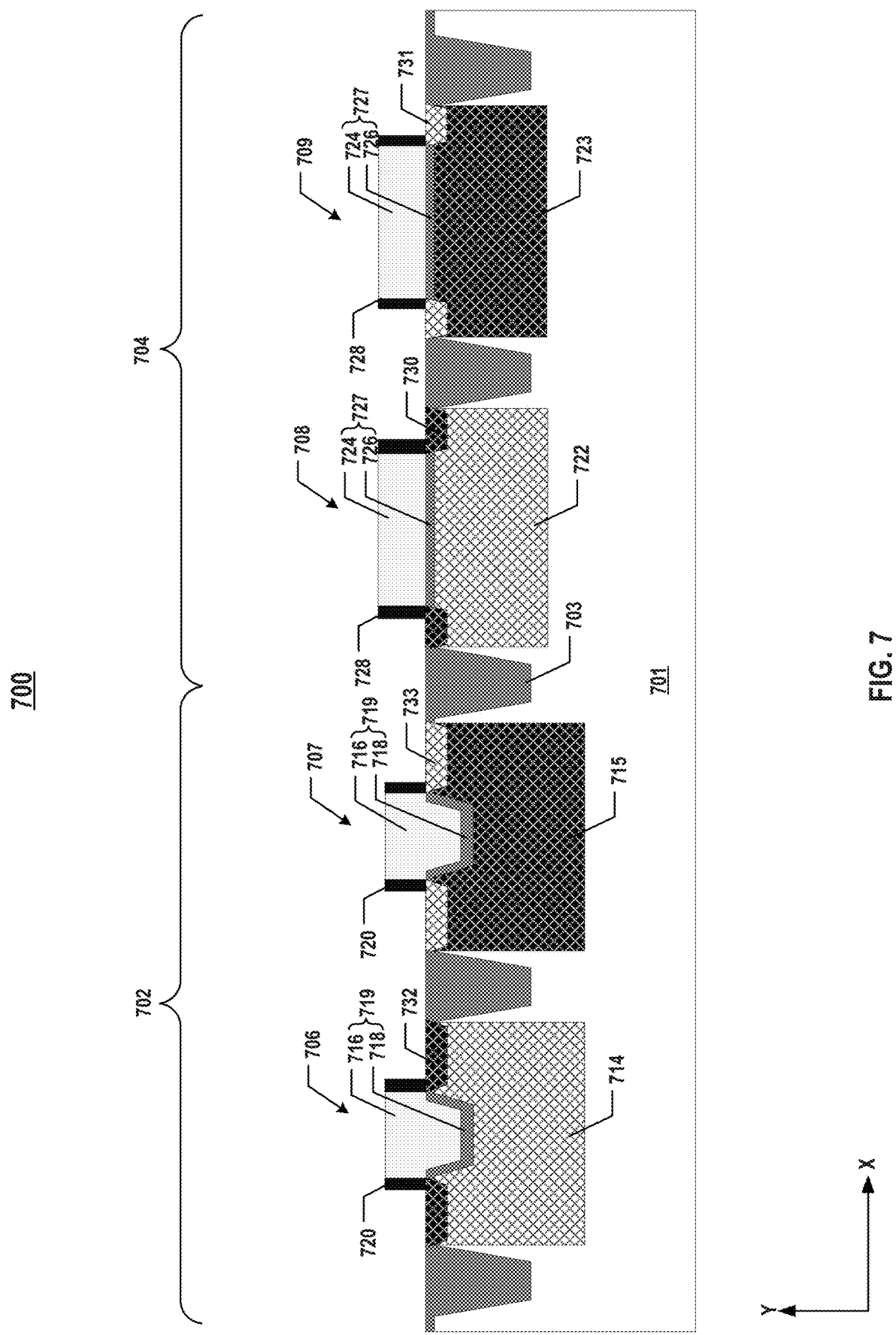
FIG. 7 illustrates a side view of a cross-section of an exemplary semiconductor device having recess gate transistors and flat gate transistors, according to some aspects of the present disclosure.

FIG. 7 illustrates a side view of a cross-section of an exemplary semiconductor device 700 having recess gate transistors 702 and flat gate transistors 704, according to some aspects of the present disclosure. Semiconductor device 700 can include peripheral circuits disclosed herein (e.g., peripheral circuits 202). In some implementations, recess gate transistors 702 are parts of a page buffer disclosed herein (e.g., page buffer 304), and flat gate transistors 704 are parts of another peripheral circuit 202 disclosed herein other than page buffer 304 (e.g., the I/O circuit including data bus 318 and/or interface 316). That is, semiconductor device 700 can include a page buffer having recess gate transistors 702 and a different peripheral circuit having flat gate transistors 704. For example, the page buffer may be formed using recess gate transistors 702, but not flat gate transistors 704, in order to reduce the size of the page buffer without sacrificing the device leakage performance, while some or all other peripheral circuits may be formed using flat gate transistors, but not recess gate transistors 702, in order to balance the fabrication complexity and device variations. It is also understood that semiconductor device 700 is not limited to peripheral circuits of a memory device and may include any semiconductor device 700 that includes a mixed type of recess gate transistors 702 and flat gate transistors 704.

Each recess gate transistor 702 or flat gate transistor 704 can be a MOS field-effect-transistor (MOSFET) on a substrate 701, which can include silicon (e.g., single crystalline silicon, c-Si), silicon germanium (SiGe), gallium arsenide (GaAs), germanium (Ge), silicon on insulator (SOI), or any other suitable materials. Semiconductor device 700 can include isolations 703, such as shallow trench isolations (STI), in substrate 701 and between adjacent recess gate transistors 702 and flat gate transistors 704 to reduce current leakage. Isolations 703 can include any suitable dielectric materials, such as silicon oxide, silicon nitride, silicon oxynitride, or high dielectric constant (high-k) dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, isolation 703 includes silicon oxide.

It is noted that x- and y-axes are added in FIG. 7 to further illustrate the spatial relationship of the components in semiconductor device 700. Substrate 701 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., semiconductor device 700) is determined relative to the substrate of the semiconductor device (e.g., substrate 701) in the y-direction (the vertical direction or thickness direction) when the substrate is positioned in the lowest plane of the semiconductor device in the y-direction. The same notion for describing the spatial relationship is applied throughout the present disclosure.

As shown in FIG. 7, in some implementations, recess gate transistors 702 and flat gate transistors 704 are formed by complementary MOS (CMOS) technology and include pairs of adjacent P-type transistors (e.g., PMOS) and N-type transistors (NMOS). A P-type recess gate transistor 706 can include an N-well 714 in substrate 701 and having a recess, and an N-type recess gate transistor 707 can include a P-well 715 in substrate 701 and having a recess. P-well 715 can be doped with any suitable P-type dopants, such as boron (B) or gallium (Ga), and N-well 714 can be doped with any suitable N-type dopants, such as phosphorus (P) or arsenic (As). It is understood that wells 714 and 715 in FIG. 7 are for illustrative purposes only. Depending on the doping type of substrate 701, N-well 714 or P-well 715 may be omitted or have different ranges and limits in substrate 701. Each recess gate transistor 702 can further include a recess gate structure 719 protruding into the recess of well 714 or 715 in substrate 701. For example, recess gate structure 719 of P-type recess gate transistor 706 may protrude into the recess of N-well 714, and recess gate structure 719 of N-type recess gate transistor 707 may protrude into the recess of P-well 715. That is, recess gate structure 719 can have two portions in the side view: a protruding portion below the top surface of substrate 701 and a flat portion above the top surface of substrate 701. As described above with respect to FIG. 6B, the depth and slope of the protruding portion of each recess gate structure 719 determines Ld, which in turn affects the effective channel length Leff of respective recess gate transistor 702. In some implementations, the depth of the protruding portion of recess gate structure 719, i.e., the depth in which recess gate structure 719 protrudes into substrate 701, is between 50 nm and 100 nm (e.g., 50 nm, 55 nm, 60 nm, 65 nm, 70 nm, 75 nm, 80 nm, 85 nm, 90 nm, 95 nm, 100 nm, any range bounded by the lower end by any of these values, or in any range defined by any two of these values).

In some implementations, recess gate structure 719 includes a bent gate dielectric 718 and a recess gate electrode 716 on bent gate dielectric 718. As shown in FIG. 7, recesses are formed in a region of substrate 701 in which recess gate transistors 702 are formed, according to some implementations. Each recess can be surrounded by N-well 714 or P-well 715. That is, part of substrate 701 in which well 714 or 715 is formed can be removed from the top surface to form a recess, as described below in detail with respect to the fabrication process. In some implementations, the depth of the recess is the same as the depth of the protruding portion of recess gate structure 719 and is between 50 nm and 100 nm (e.g., 50 nm, 55 nm, 60 nm, 65 nm, 70 nm, 75 nm, 80 nm, 85 nm, 90 nm, 95 nm, 100 nm, any range bounded by the lower end by any of these values, or in any range defined by any two of these values).

Bent gate dielectric 718 can be formed on the sidewall and the bottom surface of each recess. As a result, bent gate dielectric 718 has a bent shape in the side view, following the sidewall and bottom shape of the recess, according to some implementations. Bent gate dielectric 718 can include any suitable dielectric materials, such as silicon oxide, silicon nitride, silicon oxynitride, or high-k dielectrics. In some implementations, bent gate dielectric 718 includes silicon oxide, i.e., a bent gate oxide. Recess gate electrode 716 is above and in contact with bent gate dielectric 718, according to some implementations. As shown in FIG. 7, recess gate electrode 716 can include two portions in the side view as well: a protruding portion below the top surface of substrate 701 and a flat portion above the top surface of substrate 701. That is, the recess in substrate 701 can be filled with bent gate dielectric 718 and the protruding portion of recess gate electrode 716. Recess gate electrode 716 can include any suitable conductive materials, such as polysilicon, metals (e.g., tungsten, copper, aluminum, etc.), metal compounds (e.g., titanium nitride, tantalum nitride, etc.), or silicides. In some implementations, recess gate electrode 716 includes polysilicon, i.e., a recess gate poly.

As shown in FIG. 7, each recess gate transistor 702 can further include a pair of a source and a drain spaced apart by recess gate structure 719. For example, P-type recess gate transistor 706 may include a P-type source 732 and a P-type drain 732 in N-well 714. P-type source and drain 732 may be spaced apart by recess gate structure 719, i.e., bent gate dielectric 718 and recess gate electrode 716. Similarly, N-type recess gate transistor 707 may include an N-type source 733 and an N-type drain 733 in P-well 715. N-type source and drain 733 may be spaced apart by recess gate structure 719, i.e., bent gate dielectric 718 and recess gate electrode 716. P-type source and drain 732 can be doped with any suitable P-type dopants, such as B or Ga, and N-type source and drain 733 can be doped with any suitable N-type dopants, such as P or Ar. As described above with respect to FIG. 6B, the junction depth, i.e., the depth of drain/source 732 or 733, also affects the effective channel length Leff of respective recess gate transistor 702. As shown in FIG. 7, in some implementation, recess gate structure 719 protrudes below source and drain 732 or 733. That is, the lower end of recess gate structure 719 can be lower than the lower ends of source and drain 732 or 733.

In some implementations, each recess gate transistor 702 further includes spacers 720 on the sidewall of the flat portion of recess gate electrode 716, i.e., the part that is above substrate 701. Spacers 720 can include any suitable dielectric materials, such as silicon oxide, silicon nitride, silicon oxynitride, or high-k dielectrics. In some implementations, spacers 720 include silicon nitride. It is understood that each recess gate transistor 702 may include or be coupled with additional components not shown in FIG. 7, for example, additional dielectric layers or contacts (e.g., source and drain contacts).

Similarly, as shown in FIG. 7, a P-type flat gate transistor 708 can include an N-well 722 in substrate 701, and an N-type flat gate transistor 709 can include a P-well 723 in substrate 701. N-well 722 can be doped with any suitable N-type dopants, such as P or Ar, and P-well 723 can be doped with any suitable P-type dopants, such as B or Ga. It is understood that wells 722 and 723 in FIG. 7 are for illustrative purposes only. Depending on the doping type of substrate 701, N-well 722 or P-well 723 may be omitted or have different ranges and limits in substrate 701. Each flat gate transistor 704 can further include a flat gate structure 727. Different from recess gate structure 719, flat gate structure 727 does not protrude into substrate 701, according to some implementations. In some implementations, due to the existence of the protruding portion of recess gate structure 719, the depth of well 714 or 715 in recess gate transistor 702 is greater than the depth of well 722 or 723 in flat gate transistor 704.

In some implementations, flat gate structure 727 includes a flat gate dielectric 726 and a flat gate electrode 724 on bent gate dielectric 718. Different from recess gate transistors 702, recesses are not formed in a region of substrate 701 in which flat gate transistors 704 are formed, according to some implementations. Thus, flat gate dielectric 726 can be formed on the top surface of substrate 701. As a result, flat gate dielectric 726 has a straight shape in the side view, according to some implementations. Flat gate dielectric 726 can include any suitable dielectric materials, such as silicon oxide, silicon nitride, silicon oxynitride, or high-k dielectrics. In some implementations, flat gate dielectric 726 includes silicon oxide, i.e., a flat gate oxide. Flat gate electrode 724 is above and in contact with flat gate dielectric 726, according to some implementations. Different from recess gate transistors 702, the entirety of flat gate electrode 724 can be above the top surface of substrate 701. Flat gate electrode 724 can include any suitable conductive materials, such as polysilicon, metals, metal compounds, or silicides. In some implementations, flat gate electrode 724 includes polysilicon, i.e., a flat gate poly.

As shown in FIG. 7, each flat gate transistor 704 can further include a pair of a source and a drain in well 722 or 723. For example, P-type flat gate transistor 708 may include a P-type source 730 and a P-type drain 730 in N-well 722, and N-type flat gate transistor 709 may include an N-type source 731 and an N-type drain 731 in P-well 723. P-type source and drain 730 can be doped with any suitable P-type dopants, such as B or Ga, and N-type source and drain 731 can be doped with any suitable N-type dopants, such as P or Ar. In some implementations, the doping concentration of source/drain 732 or 733 in recess gate transistor 702 is different from the doping concentration of source/drain 730 or 731 in flat gate transistor 704, such that the threshold voltage of recess gate transistor 702 is different from the threshold voltage of flat gate transistor 704. For example, the doping concentration of source/drain 732 or 733 in recess gate transistor 702 and the doping concentration of source/drain 730 or 731 in flat gate transistor 704 may be controlled in a manner such that the threshold voltage of flat gate transistor 704 is greater than the threshold voltage of recess gate transistor 702.

In some implementations, each flat gate transistor 704 further includes spacers 728 on the sidewall of flat gate electrode 724. Spacers 728 can include any suitable dielectric materials, such as silicon oxide, silicon nitride, silicon oxynitride, or high-k dielectrics. In some implementations, spacers 728 include silicon nitride. It is understood that each recess gate transistor 704 may include or be coupled with additional components not shown in FIG. 7, for example, additional dielectric layers or contacts (e.g., source and drain contacts).

As described above with respect to FIGS. 6A and 6B, compared with flat gate transistor 704, recess gate transistor 702 can reduce the gate length L in the plan view while keeping the same effective gate length Leff by the addition of Ld due to the protrusion shape of recess gate structure. As a result, in some implementations, a dimensional (e.g., gate length L) of flat gate transistor 704 is greater than the dimension (e.g., gate length L) of recess gate transistor 702 in the plan view.

Figure 8A:
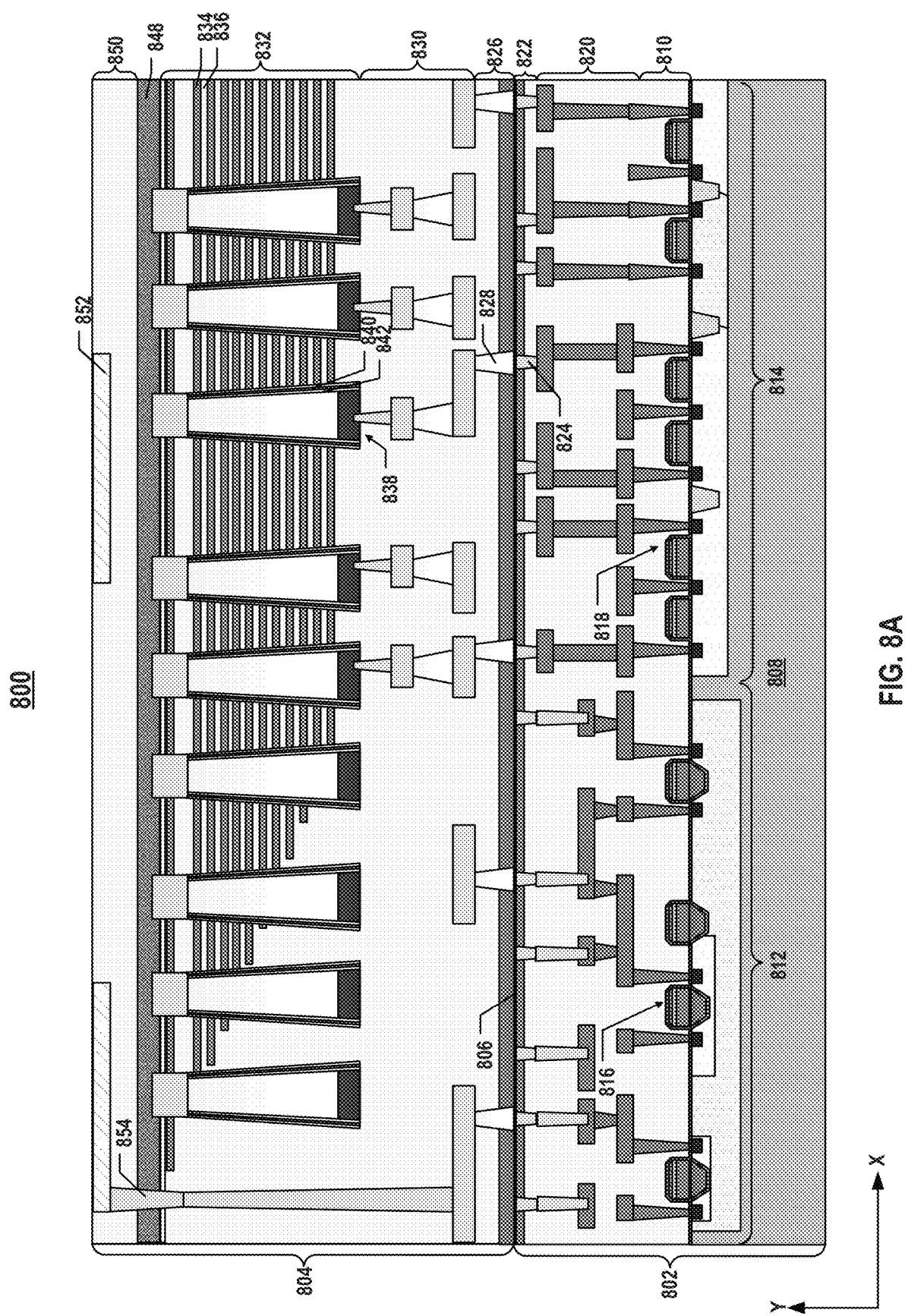
FIG. 8A illustrates a side view of a cross-section of an exemplary 3D memory device, according to some implementations.

As described above with respect to FIGS. 1A and 1B, semiconductor device 700 may be an example of second semiconductor structure 104 bonded with first semiconductor structure 102 having a memory cell array. For example, FIG. 8A illustrates a side view of a cross-section of an exemplary 3D memory device 800, according to some implementations. As one example of 3D memory device 101 described above with respect to FIG. 1B, 3D memory device 800 is a bonded chip including a first semiconductor structure 802 and a second semiconductor structure 804 stacked over first semiconductor structure 802. First and second semiconductor structures 802 and 804 are jointed at a bonding interface 806 therebetween, according to some implementations. As shown in FIG. 8A, first semiconductor structure 802 can include a substrate 808, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 802 can include a device layer 810 above substrate 808. Semiconductor device 700 having recess gate transistors 702 and flat gate transistors 704 may be an example of device layer 810. In some implementations, device layer 810 includes peripheral circuits including a page buffer 812 and other peripheral circuits 814 (e.g., the I/O circuit). In some implementations, page buffer 812 includes a plurality of recess gate transistors 816, and other peripheral circuits 814 include a plurality of flat gate transistors 818, as described above in detail with respect to FIG. 7. Isolations (e.g., STIs) and doped regions (e.g., source and drain of transistors 816 and 818) can be formed in substrate 808 as well. Transistors 816 and 818 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations.

In some implementations, first semiconductor structure 802 further includes an interconnect layer 820 above device layer 810 to transfer electrical signals to and from peripheral circuits 812 and 814. Interconnect layer 820 can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. Interconnect layer 820 can further include one or more interlayer dielectric (ILD) layers (also known as "intermetal dielectric (IMD) layers") in which the interconnect lines and via contacts can form. That is, interconnect layer 820 can include interconnect lines and via contacts in multiple ILD layers. In some implementations, the devices in device layer 810 are coupled to one another through the interconnects in interconnect layer 820. For example, page buffer 812 may be coupled to other peripheral circuits 814 through interconnect layer 820.

As shown in FIG. 8A, first semiconductor structure 802 can further include a bonding layer 822 at bonding interface 806 and above interconnect layer 820 and device layer 810. Bonding layer 822 can include a plurality of bonding contacts 824 and dielectrics electrically isolating bonding contacts 824. Bonding contacts 824 can include conductive materials. The remaining area of bonding layer 822 can be formed with dielectric materials. Bonding contacts 824 and surrounding dielectrics in bonding layer 822 can be used for hybrid bonding. Similarly, as shown in FIG. 8A, second semiconductor structure 804 can also include a bonding layer 826 at bonding interface 806 and above bonding layer 822 of first semiconductor structure 802. Bonding layer 826 can include a plurality of bonding contacts 828 and dielectrics electrically isolating bonding contacts 828. Bonding contacts 828 can include conductive materials. The remaining area of bonding layer 826 can be formed with dielectric materials. Bonding contacts 828 and surrounding dielectrics in bonding layer 826 can be used for hybrid bonding. Bonding contacts 828 are in contact with bonding contacts 824 at bonding interface 806, according to some implementations.

Second semiconductor structure 804 can be bonded on top of first semiconductor structure 802 in a face-to-face manner at bonding interface 806. In some implementations, bonding interface 806 is disposed between bonding layers 822 and 826 as a result of hybrid bonding (also known as "metal/ dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 806 is the place at which bonding layers 822 and 826 are met and bonded. In practice, bonding interface 806 can be a layer with a certain thickness that includes the top surface of bonding layer 822 of first semiconductor structure 802 and the bottom surface of bonding layer 826 of second semiconductor structure 804.

In some implementations, second semiconductor structure 804 further includes an interconnect layer 830 above bonding layer 826 to transfer electrical signals. Interconnect layer 830 can include a plurality of interconnects, such as MEOL interconnects and BEOL interconnects. In some implementations, the interconnects in interconnect layer 830 also include local interconnects, such as bit line contacts and word line contacts. Interconnect layer 830 can further include one or more ILD layers in which the interconnect lines and via contacts can form.

In some implementations, second semiconductor structure 804 includes a NAND Flash memory device in which memory cells are provided in the form of an array of NAND memory strings 838 above interconnect layer 830 and bonding layer 826. Each NAND memory string 838 extends vertically through a plurality of pairs each including a conductive layer 834 and a dielectric layer 836, according to some implementations. The stacked and interleaved conductive layers 834 and dielectric layer 836 are also referred to herein as a memory stack 832. Interleaved conductive layers 834 and dielectric layers 836 in memory stack 832 alternate in the vertical direction, according to some implementations.

In some implementations, each NAND memory string 838 is a "charge trap" type of NAND memory string including a semiconductor channel 842 and a memory film 840. In some implementations, semiconductor channel 842 includes silicon, such as amorphous silicon, polysilicon, or single crystalline silicon. In some implementations, memory film 840 is a composite dielectric layer including a tunneling layer, a storage layer (also known as "charge trap/storage layer"), and a blocking layer. Each NAND memory string 838 can have a cylinder shape (e.g., a pillar shape). Semiconductor channel 842, the tunneling layer, the storage layer, and the blocking layer of memory film 840 are arranged along a direction from the center toward the outer surface of the pillar in this order, according to some implementations. In some implementations, NAND memory strings 838 further include a plurality of control gates (each being part of a word line). Each conductive layer 834 in memory stack 832 can act as a control gate for each memory cell of NAND memory string 838.

In some implementations, second semiconductor structure 804 further includes a semiconductor layer 848 disposed above memory stack 832 and NAND memory strings 838. Semiconductor layer 848 can be a thinned substrate on which memory stack 832 and NAND memory strings 838 are formed. In some implementations, semiconductor layer 848 includes single crystalline silicon. Semiconductor layer 848 can also include isolations and doped regions (e.g., functioning as an array common source (ACS) for NAND memory strings 838, not shown). It is understood that NAND memory strings 838 are not limited to the "charge trap" type of NAND memory strings and may be "floating gate" type of NAND memory strings in other examples. Semiconductor layer 848 may include polysilicon as the source plate of the "floating gate" type of NAND memory strings.

As shown in FIG. 8A, second semiconductor structure 804 can further include a pad-out interconnect layer 850 above semiconductor layer 848. Pad-out interconnect layer 850 can include interconnects, e.g., contact pads 852, in one or more ILD layers. Pad-out interconnect layer 850 and interconnect layer 830 can be formed at opposite sides of semiconductor layer 848. In some implementations, the interconnects in pad-out interconnect layer 850 can transfer electrical signals between 3D memory device 800 and outside circuits, e.g., for pad-out purposes. In some implementations, second semiconductor structure 804 further includes one or more contacts 854 extending through semiconductor layer 848 to electrically connect pad-out interconnect layer 850 and interconnect layers 830 and 820. As a result, peripheral circuits 812 and 814 can be coupled to array of NAND memory strings 838 through interconnect layers 830 and 820 as well as bonding contacts 828 and 824. That is, array of NAND memory strings 838 can be coupled to page buffer 812 across bonding interface 806. Moreover, peripheral circuits 812 and 814 and array of NAND memory strings 838 can be coupled to outside circuits through contacts 854 and pad-out interconnect layer 850.

Figure 8B:
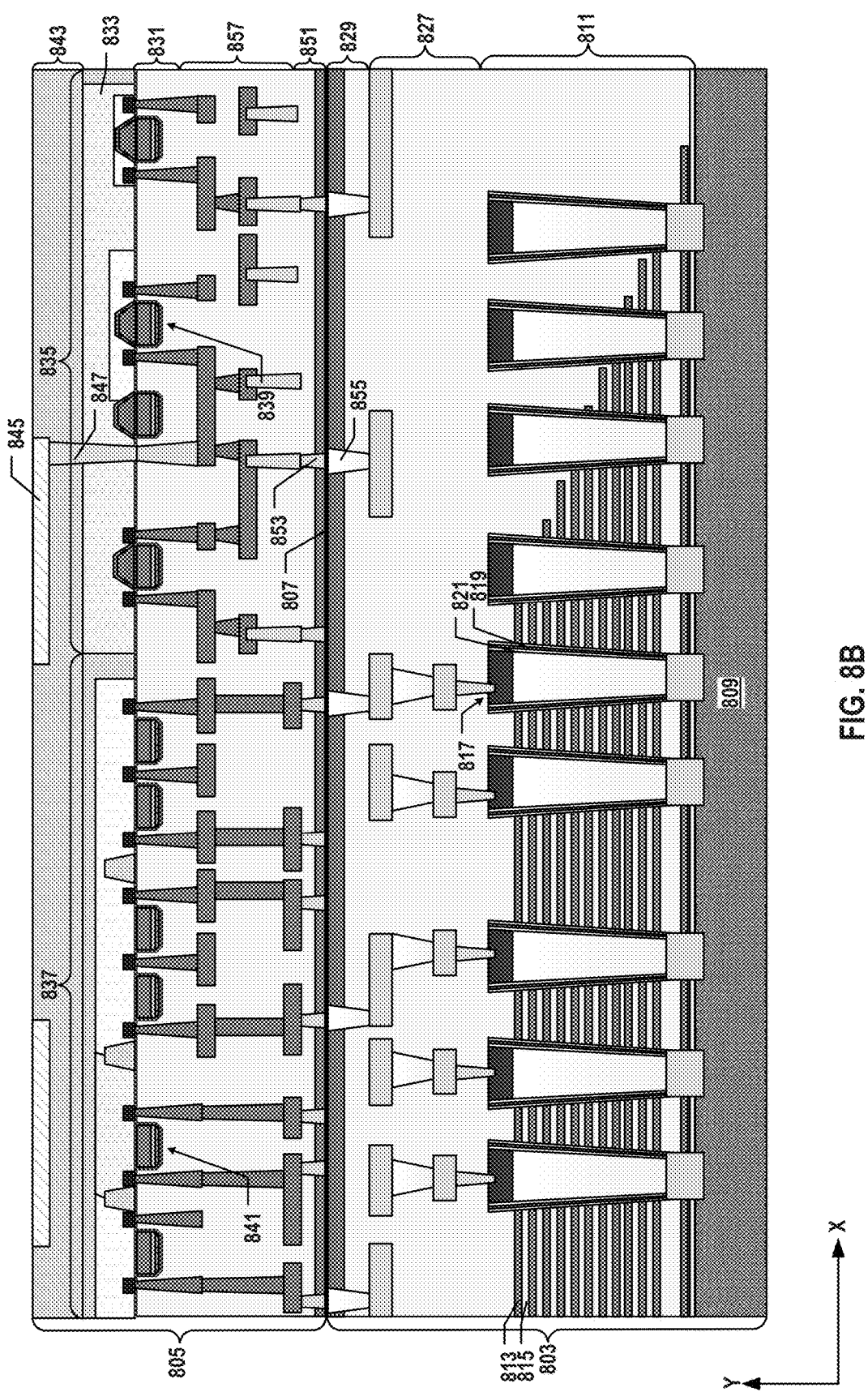
FIG. 8B illustrates a side view of a cross-section of another exemplary 3D memory device, according to some implementations.

FIG. 8B illustrates a cross-section of another exemplary 3D memory device 801, according to some aspects of the present disclosure. As one example of 3D memory device 100 described above with respect to FIG. 1A, 3D memory device 801 is a bonded chip including a second semiconductor structure 803 and a first semiconductor structure 805 stacked over second semiconductor structure 803. Similar to 3D memory device 800 described above in FIG. 8A, 3D memory device 801 represents an example of a bonded chip in which first semiconductor structure 805 and second semiconductor structure 803 are formed separately and bonded in a face-to-face manner at a bonding interface 807. It is understood that the details of similar structures (e.g., materials, fabrication process, functions, etc.) in both 3D memory devices 800 and 801 may not be repeated below.

Second semiconductor structure 803 can include a substrate 809 and a memory stack 811 including interleaved conductive layers 813 and dielectric layers 815 above substrate 809. In some implementations, an array of NAND memory strings 817 each extends vertically through interleaved conductive layers 813 and dielectric layers 815 in memory stack 811 above substrate 809. Each NAND memory string 817 can include a semiconductor channel 821 and a memory film 819. NAND memory strings 817 can be "charge trap" type of NAND memory strings or "floating gate" type of NAND memory strings.

In some implementations, second semiconductor structure 803 also includes an interconnect layer 827 above memory stack 811 and NAND memory strings 817 to transfer electrical signals to and from NAND memory strings 817. Interconnect layer 827 can include a plurality of interconnects, including interconnect lines and via contacts. In some implementations, the interconnects in interconnect layer 827 also include local interconnects, such as bit line contacts and word line contacts. In some implementations, second semiconductor structure 803 further includes a bonding layer 829 at bonding interface 807 and above interconnect layer 827 and memory stack 811 and NAND memory strings 817. Bonding layer 829 can include a plurality of bonding contacts 855 and dielectrics surrounding and electrically isolating bonding contacts 855.

As shown in FIG. 8B, first semiconductor structure 805 includes another bonding layer 851 at bonding interface 807 and above bonding layer 829. Bonding layer 851 can include a plurality of bonding contacts 853 and dielectrics surrounding and electrically isolating bonding contacts 853. Bonding contacts 853 are in contact with bonding contacts 855 at bonding interface 807, according to some implementations. In some implementations, first semiconductor structure 805 also includes an interconnect layer 857 above bonding layer 851 to transfer electrical signals. Interconnect layer 857 can include a plurality of interconnects, including interconnect lines and via contacts.

First semiconductor structure 805 can further include a device layer 831 above interconnect layer 857 and bonding layer 851. Semiconductor device 700 having recess gate transistors 702 and flat gate transistors 704 may be an example of device layer 831. In some implementations, device layer 831 includes peripheral circuits including a page buffer 835 and other peripheral circuits 837 (e.g., the I/O circuit.). In some implementations, page buffer 835 includes a plurality of recess gate transistors 839, and other peripheral circuits 837 include a plurality of flat gate transistors 841, as described above in detail with respect to FIG. 7. Transistors 839 and 841 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations.

In some implementations, first semiconductor structure 805 further includes semiconductor layer 833 disposed above device layer 831. Semiconductor layer 833 can be above and in contact with peripheral circuits 835 and 837. Semiconductor layer 833 can be a thinned substrate on which transistors 839 and 841 are formed. In some implementations, semiconductor layer 833 includes single crystalline silicon. Semiconductor layer 833 can also include isolations and doped regions.

As shown in FIG. 8B, first semiconductor structure 805 can further include a pad-out interconnect layer 843 above semiconductor layer 833. Pad-out interconnect layer 843 can include interconnects, e.g., contact pads 845, in one or more ILD layers. In some implementations, the interconnects in pad-out interconnect layer 843 can transfer electrical signals between 3D memory device 801 and outside circuits, e.g., for pad-out purposes. In some implementations, first semiconductor structure 805 further includes one or more contacts 847 extending through semiconductor layer 833 to couple pad-out interconnect layer 843 and interconnect layers 857 and 827. As a result, peripheral circuits 835 and 837 can also be coupled to array of NAND memory strings 817 through interconnect layers 857 and 827 as well as bonding contacts 853 and 855. That is, array of NAND memory strings 817 can be coupled to page buffer 835 across bonding interface 807. Moreover, peripheral circuits 835 and 837 and array of NAND memory strings 817 can be electrically connected to outside circuits through contacts 847 and pad-out interconnect layer 843.

Figure 8C:
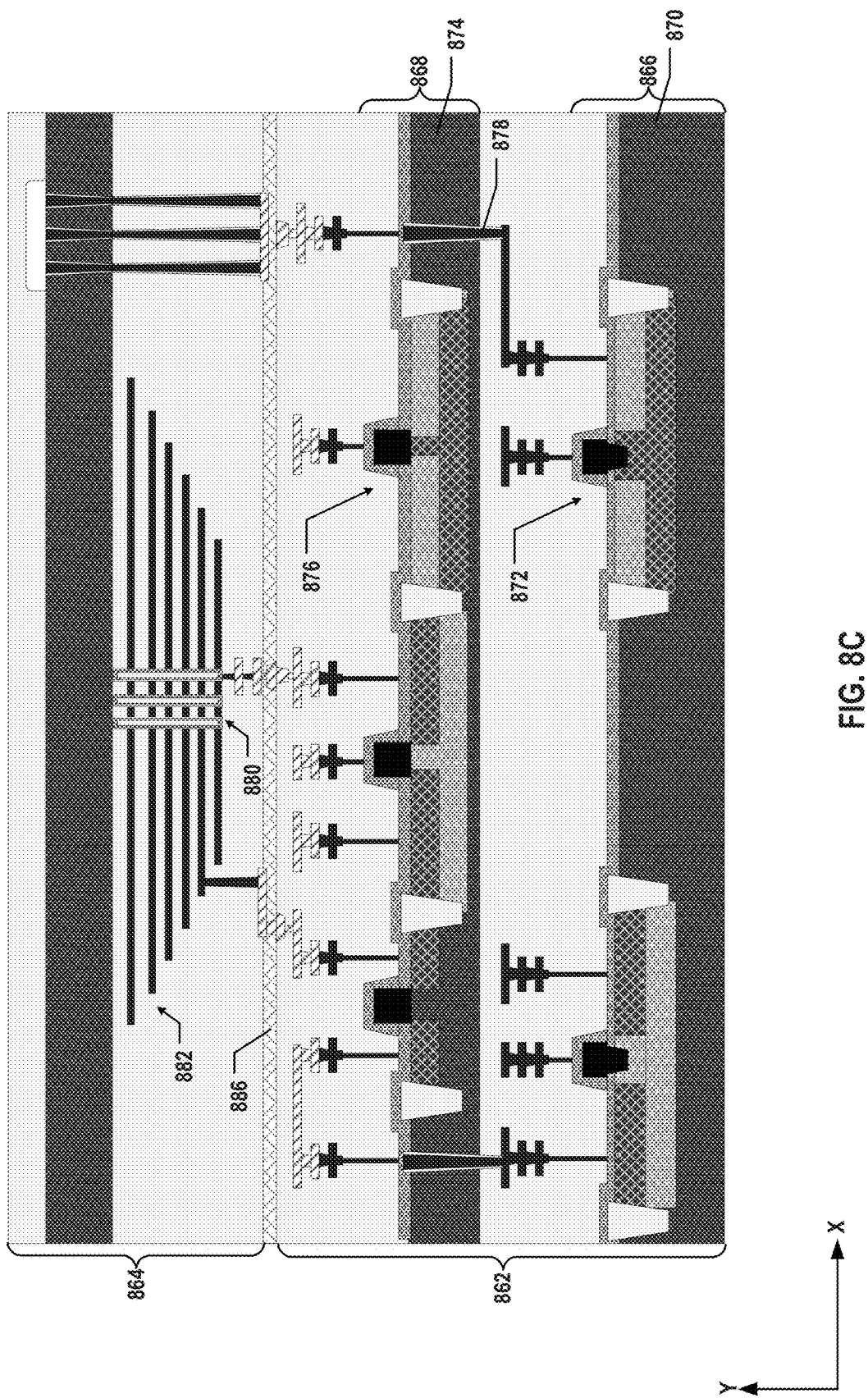
FIG. 8C illustrates a side view of a cross-section of still another exemplary 3D memory device, according to some implementations.

To further reduce the footprint of the peripheral circuits, the peripheral circuits of 3D memory devices may be arranged in multiple planes stacked over in the vertical direction, as opposed to in the same plane (e.g., on the same substrate as shown in FIGS. 8A and 8B). For example, FIG. 8C illustrates a side view of a cross-section of still another exemplary 3D memory device 860, according to some implementations. As one example of 3D memory device 101 described above with respect to FIG. 1B, 3D memory device 860 is a bonded chip including a first semiconductor structure 862 and a second semiconductor structure 864 stacked over first semiconductor structure 862. Similar to 3D memory device 800 described above in FIG. 8A, 3D memory device 801 represents an example of a bonded chip in which first semiconductor structure 862 and second semiconductor structure 864 are formed separately and bonded in a face-to-face manner at a bonding interface 886. It is understood that the details of similar structures (e.g., materials, fabrication process, functions, etc.) in both 3D memory devices 800 and 860 may not be repeated below.

Different from first semiconductor structure 802 in FIG. 8A that includes a single device layer 810, first semiconductor structure 862 of 3D memory device 860 in FIG. 8C can include a plurality of device layers in different planes in the vertical direction, such as a first device layer 866 and a second device layer 868 stacked over first device layer 866. First and second device layers 866 and 868 can include a first semiconductor layer 870 and a second semiconductor layer 874, respectively. In some implementations, each semiconductor layer 870 or 874 includes single crystalline silicon. As shown in FIG. 8C, in some implementations, first device layer 866 includes a plurality of recess gate transistors 872 formed in semiconductor layer 870. Recess gate transistor 702 may be an example of recess gate transistor 872 in first device layer 866. First device layer 866 can include a page buffer having recess gate transistors 872 as described in the present disclosure. In some implementations, all the transistors in first device layer 866 are recess gate transistor 872. That is, first device layer 866 does not include any flat gate transistors, according to some implementations.

As shown in FIG. 8C, in some implementations, second device layer 868 includes a plurality of flat gate transistors 876 formed on semiconductor layer 874. Flat gate transistor 704 may be an example of flat gate transistor 876 in second device layer 868. Second device layer 868 can include a peripheral circuit other than the page buffer, such as an I/O circuit, having flat gate transistor 876 as described in the present disclosure. In some implementations, all the transistors in second device layer 868 are flat gate transistor 876. That is, second device layer 868 does not include any recess gate transistors, according to some implementations. By separating flat gate transistor 876 and recess gate transistor 872 into different device layers in different planes, flat gate transistor 876 and recess gate transistor 872 may be fabricated in different processes, thereby reducing the fabrication complexity.

In some implementations, through silicon contacts (TSC) 878 are formed through semiconductor layer 874 between flat gate transistor 876 and recess gate transistor 872 to electrically connect flat gate transistor 876 and recess gate transistor 872 in different device layers.

Similar to second semiconductor structure 804 in FIG. 8A, second semiconductor structure 864 of 3D memory device 860 can also include an array of NAND memory strings 880 extending vertically through a memory stack 882. Flat gate transistor 876 and recess gate transistor 872 in first semiconductor structure 862 can be electrically connected to NAND memory strings 838 through TSCs 878 and other interconnects and bonding contacts as described above in detail with respect to FIG. 8A. It is understood that the number of device layers in first semiconductor structure 862 and the relative positions and directions of flat gate transistor 876 and recess gate transistor 872 in first semiconductor structure 862 are not limited to the example shown in FIG. 8C and may vary in other examples. In one example, the relative positions of flat gate transistor 876 and recess gate transistor 872 may change from the example in FIG. 8C. In another example, the relative directions of flat gate transistor 876 and recess gate transistor 872 may change from facing the same direction to face-to-face or back-to-back. It is further understood that the relative positions and directions of first and second semiconductor structures 862 and 864 may vary in other examples as well.

Figure 8D:
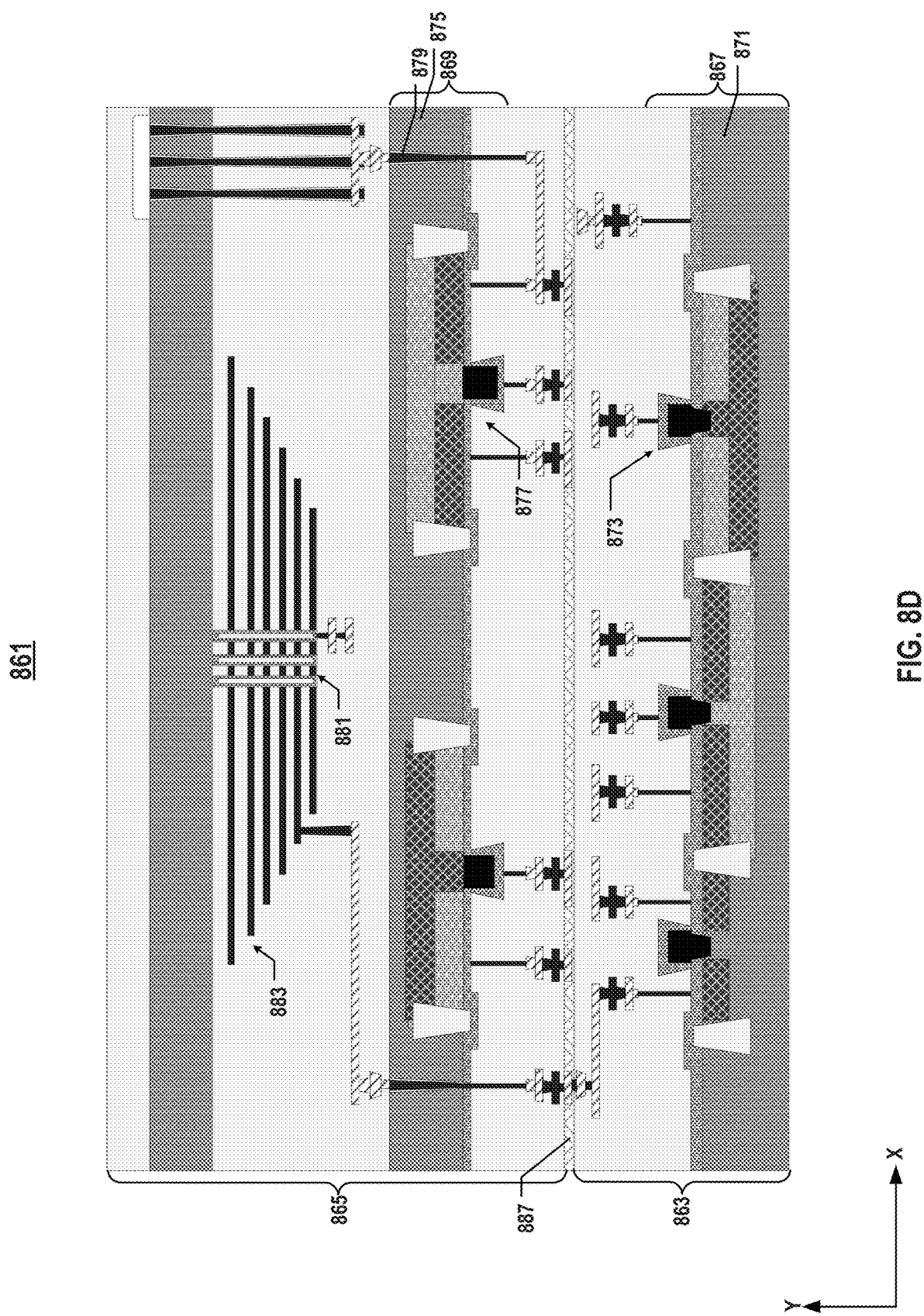
FIG. 8D illustrates a side view of a cross-section of yet another exemplary 3D memory device, according to some implementations.

In some implementations, flat gate transistor 876 and recess gate transistor 872 are not only in different device layers in different planes, but also in different semiconductor structures. For example, FIG. 8D illustrates a side view of a cross-section of yet another exemplary 3D memory device 861, according to some implementations. As one example of 3D memory device 101 described above with respect to FIG. 1B, 3D memory device 861 is a bonded chip including a first semiconductor structure 863 and a second semiconductor structure 865 stacked over first semiconductor structure 863. Similar to 3D memory device 800 described above in FIG. 8A, 3D memory device 801 represents an example of a bonded chip in which first semiconductor structure 863 and second semiconductor structure 865 are formed separately and bonded in a face-to-face manner at a bonding interface 887. It is understood that the details of similar structures (e.g., materials, fabrication process, functions, etc.) in both 3D memory devices 800 and 861 may not be repeated below.

Different from 3D memory device 860 in FIG. 8C in which device layers 866 and 868 are all in first semiconductor structure 862, at least a first device layer 869 is in second semiconductor structure 865 of 3D memory device 816, according to some implementations. That is, besides an array of NAND memory strings 881 extending vertically through a memory stack 883, second semiconductor structure 865 can further include first device layer 869 that includes a semiconductor layer 875 (e.g., a single crystalline silicon layer) and a plurality of flat gate transistors 877 formed on semiconductor layer 875. TSCs 879 can be formed through semiconductor layer 875 to electrically connect NAND memory strings 881 and flat gate transistors 877. First device layer 869 can include a peripheral circuit other than the page buffer, such as an I/O circuit, having flat gate transistor 877 as described in the present disclosure. In some implementations, all the transistors in first device layer 869 are flat gate transistor 877. That is, first device layer 869 does not include any recess gate transistors, according to some implementations.

As shown in FIG. 8D, first semiconductor structure 863 can include a second device layer 867 having a semiconductor layer 871 (e.g., a single crystalline silicon layer). In some implementations, second device layer 868 includes a plurality of recess gate transistors 873 formed in semiconductor layer 871. Recess gate transistor 702 may be an example of recess gate transistor 873 in second device layer 867. Second device layer 867 can include a page buffer having recess gate transistors 873 as described in the present disclosure. In some implementations, all the transistors in second device layer 867 are recess gate transistor 873. That is, second device layer 867 does not include any flat gate transistors, according to some implementations. By separating flat gate transistor 877 and recess gate transistor 873 into different device layers in different planes, as well as in different semiconductor structures, flat gate transistor 877 and recess gate transistor 873 may be fabricated in different processes, thereby reducing the fabrication complexity.

It is understood that the number of device layers in each semiconductor structure 863 or 865 and the relative positions and directions of flat gate transistor 877 and recess gate transistor 873 are not limited to the example shown in FIG. 8D and may vary in other examples. In one example, the relative positions of flat gate transistor 877 and recess gate transistor 873 may change from the example in FIG. 8D. In another example, the relative directions of flat gate transistor 877 and recess gate transistor 873 may change from face-to-face to facing the same direction or back-to-back. It is further understood that the relative positions and directions of first and second semiconductor structures 863 and 865 may vary in other examples as well.

Figure 12:
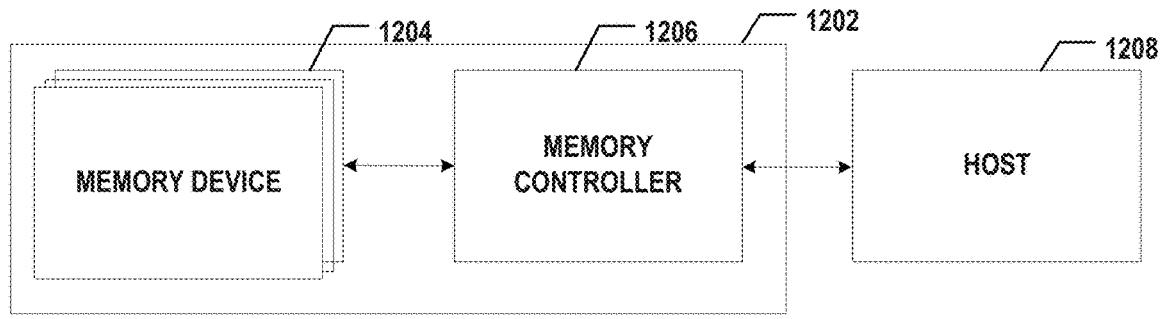
FIG. 12 illustrates a block diagram of an exemplary system having a memory device, according to some aspects of the present disclosure.

FIG. 12 illustrates a block diagram of an exemplary system 1200 having a memory device, according to some aspects of the present disclosure. System 1200 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 12, system 1200 can include a host 1208 and a memory system 1202 having one or more memory devices 1204 and a memory controller 1206. Host 1208 can be a processor of an electronic device, such as a central processing unit (CPU), or a system-on-chip (SoC), such as an application processor (AP). Host 1208 can be configured to send or receive the data to or from memory devices 1204.

Memory device 1204 can be any memory devices disclosed herein, such as 3D memory devices 100 and 101, memory device 200, and 3D memory devices 800, 801, 860, and 861. In some implementations, each memory device 1204 includes peripheral circuits having one or more page buffers. Consistent with the scope of the present disclosure, the page buffer, the dominating factor of chip size, has recess gate transistors instead of flat gate transistors in order to shrink the device size while maintaining the comparable or even better device leakage performance. The peripheral circuits other than the page buffer can still use flat gate transistors, which can reduce the fabrication complexity and device structure and performance variations compared to using recess gate transistor.

Memory controller 1206 is coupled to memory device 1204 and host 1208 and is configured to control memory device 1204, according to some implementations. Memory controller 1206 can manage the data stored in memory device 1204 and communicate with host 1208. In some implementations, memory controller 1206 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1206 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1206 can be configured to control operations of memory device 1204, such as read, erase, and program operations. Memory controller 1206 can also be configured to manage various functions with respect to the data stored or to be stored in memory device 1204 including, but not limited to bad-block management, garbage collection, logical-to-physical address conversion, wear leveling, etc. In some implementations, memory controller 1206 is further configured to process error correction codes (ECCs) with respect to the data read from or written to memory device 1204. Any other suitable functions may be performed by memory controller 1206 as well, for example, formatting memory device 1204. Memory controller 1206 can communicate with an external device (e.g., host 1208) according to a particular communication protocol. For example, memory controller 1206 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 13A:
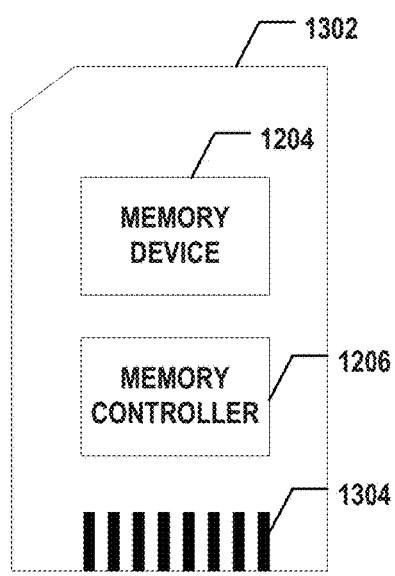
FIG. 13A illustrates a diagram of an exemplary memory card having a memory device, according to some aspects of the present disclosure.
Figure 13B:
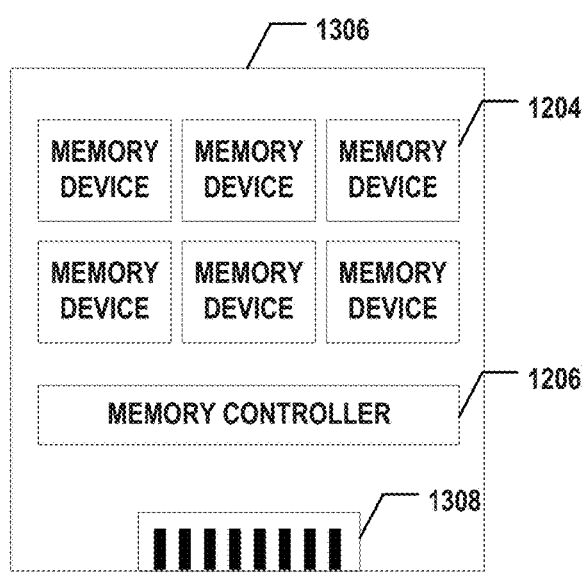
FIG. 13B illustrates a diagram of an exemplary solid-state drive (SSD) having a memory device, according to some aspects of the present disclosure.

Memory controller 1206 and one or more memory devices 1204 can be integrated into various types of storage devices, for example, be included in the same package, such as a universal Flash storage (UFS) package or an eMMC package. That is, memory system 1202 can be implemented and packaged into different types of end electronic products. In one example as shown in FIG. 13A, memory controller 1206 and a single memory device 1204 may be integrated into a memory card 1302. Memory card 1302 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1302 can further include a memory card connector 1304 coupling memory card 1302 with a host (e.g., host 1208 in FIG. 12). In another example as shown in FIG. 13B, memory controller 1206 and multiple memory devices 1204 may be integrated into an SSD 1306. SSD 1306 can further include an SSD connector 1308 coupling SSD 1306 with a host (e.g., host 1208 in FIG. 12). In some implementations, the storage capacity and/or the operation speed of SSD 1306 is greater than those of memory card 1302.

Figure 10:
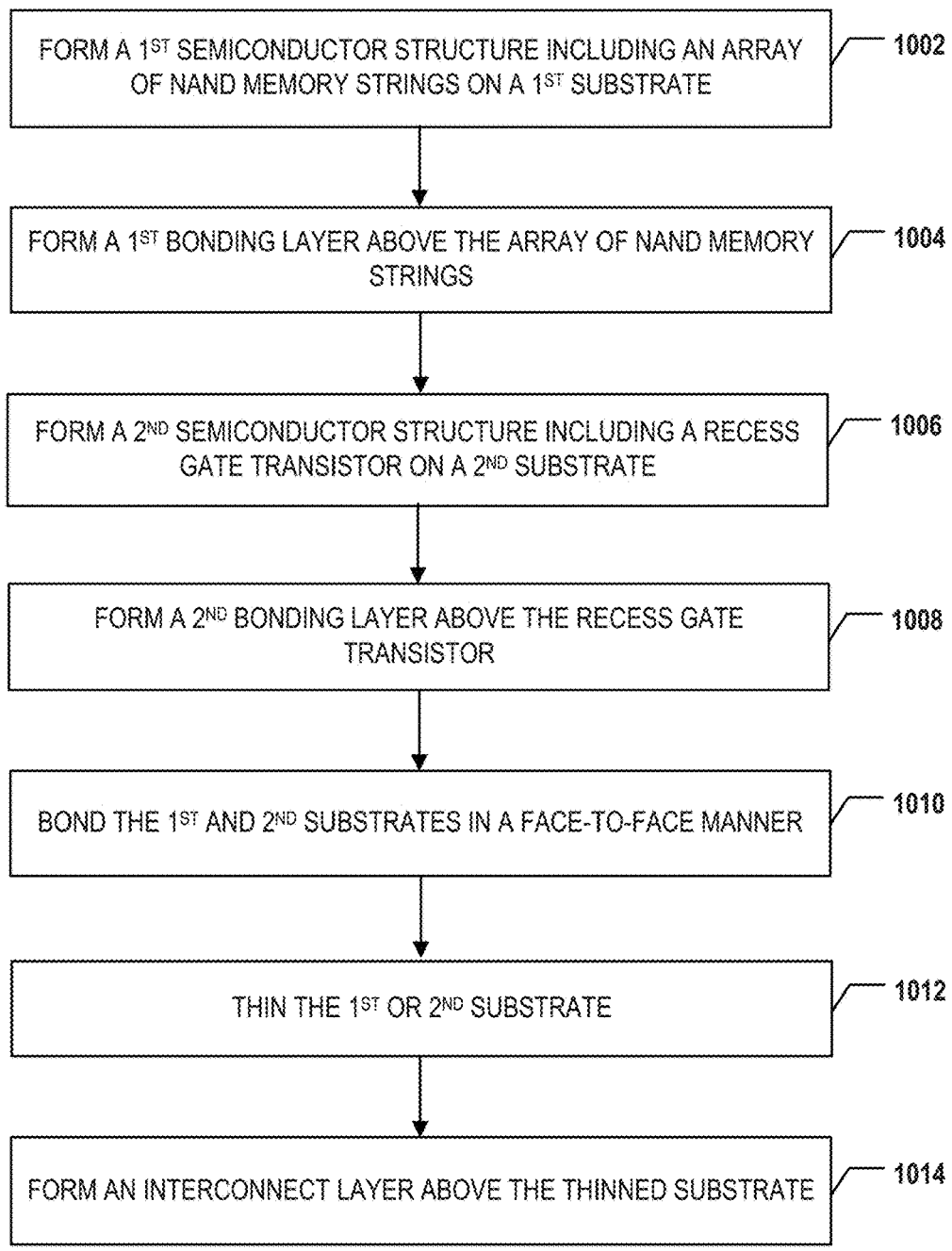
FIG. 10 illustrates a flowchart of a method for forming an exemplary 3D memory device, according to some aspects of the present disclosure.
Figure 11:
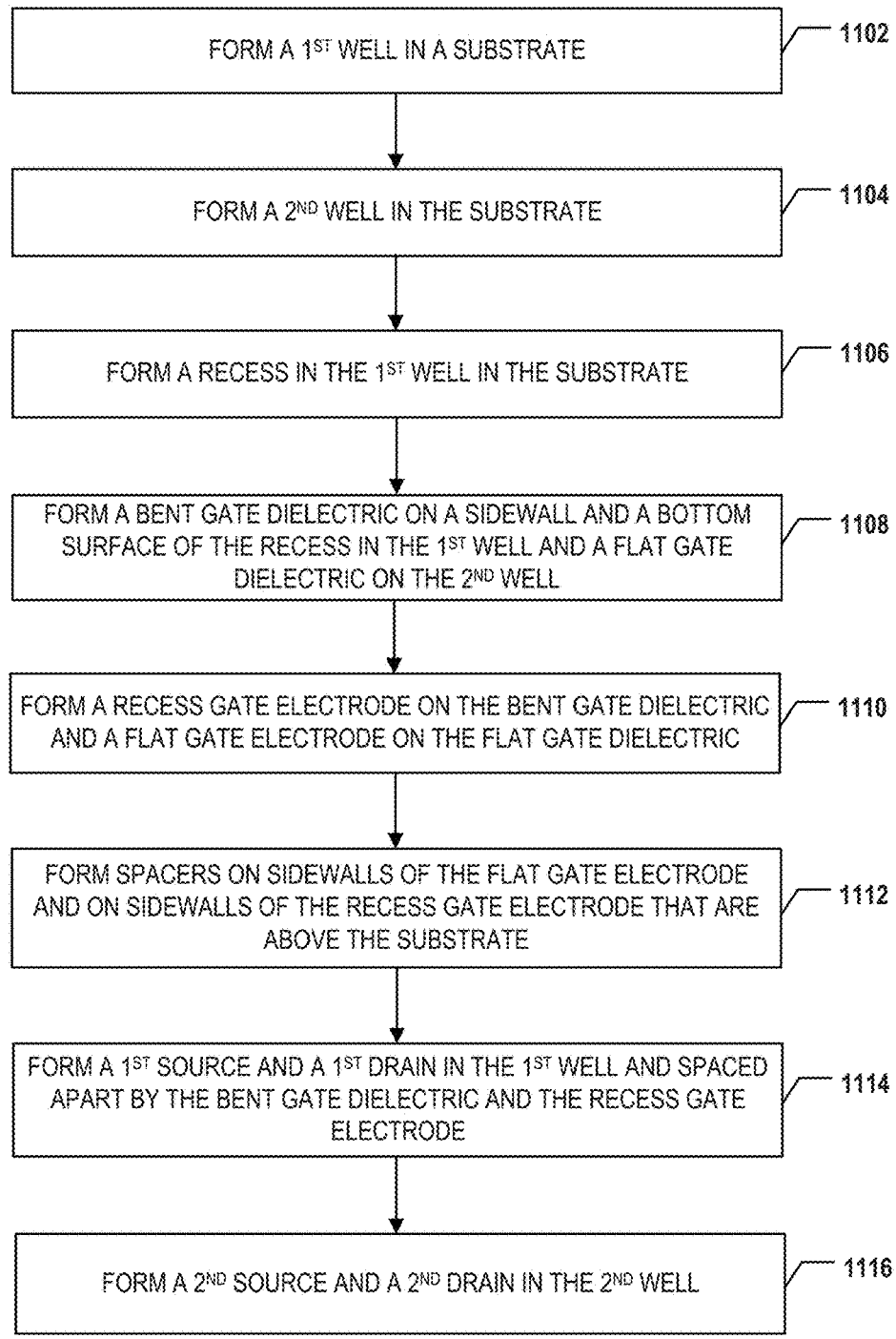
FIG. 11 illustrates a flowchart of a method for forming an exemplary semiconductor device having recess gate transistors and flat gate transistors, according to some aspects of the present disclosure.

FIGS. 9A-9J illustrate a fabrication process for forming an exemplary semiconductor device having recess gate transistors and flat gate transistors, according to some aspects of the present disclosure. FIG. 10 illustrates a flowchart of a method 1000 for forming an exemplary 3D memory device, according to some aspects of the present disclosure. FIG. 11 illustrates a flowchart of a method 1100 for forming an exemplary semiconductor device having recess gate transistors and flat gate transistors, according to some aspects of the present disclosure. Examples of the semiconductor device depicted in FIGS. 9A-9J, 10, and 11 include semiconductor device 700 depicted in FIG. 7. FIGS. 9A-9J, 10, and 11 will be described together. It is understood that the operations shown in methods 1000 and 1100 are not exhaustive and that other operations can be performed as well before, after, or between any of the illustrated operations. Further, some of the operations may be performed simultaneously, or in a different order than shown in FIGS. 10 and 11.

Referring to FIG. 10, method 1000 starts at operation 1002, in which a first semiconductor structure including an array of NAND memory strings is formed on a first substrate. For example, as illustrated in FIG. 8B, an array of NAND memory strings 817 is formed on substrate 809. Method 1000 proceeds to operation 1004, as illustrated in FIG. 10, in which a first bonding layer including a plurality of first bonding contacts is formed above the array of NAND memory strings. For example, as illustrated in FIG. 8B, bonding layer 829 including bonding contacts 855 is formed above array of NAND memory strings 817. In some implementations, to form the first semiconductor structure, a flat gate transistor is formed as well. The flat gate transistor can be formed in a device layer, and the device layer and the array of NAND memory strings can be stacked over one another, i.e., formed in different planes. For example, as illustrated in FIG. 8D, flat gate transistors 877 are formed in semiconductor layer 875 that is above array of NAND memory strings 817.

Method 1000 proceeds to operation 1006, as illustrated in FIG. 10, in which a second semiconductor structure including a recess gate transistor is formed on a second substrate. The recess gate transistor can include a recess gate structure protruding into the second substrate. In some implementations, the second semiconductor structure also includes a flat gate transistor formed on the second substrate as well. To form the recess gate transistor and the flat gate transistor on the same substrate, as shown in FIG. 11, at operation 1102, a first well is formed in the substrate. The substrate can be a silicon substrate.

Figure 9A:
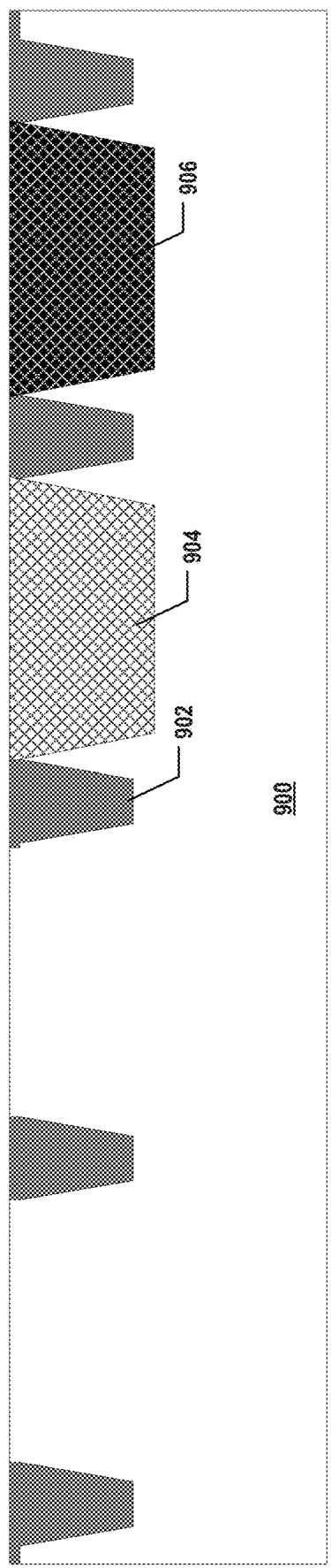
FIGS. 9A-9J illustrate a fabrication process for forming an exemplary semiconductor device having recess gate transistors and flat gate transistors, according to some aspects of the present disclosure.

As illustrated in FIG. 9A, a plurality of isolations 902, such as STIs, are formed in a silicon substrate 900, for example, using wet/dry etch and thin film deposition of silicon oxide. Isolations 902 can divide silicon substrates 900 into multiple regions in which multiple transistors can be formed, respectively. As illustrated in FIG. 9A, an N-well 904 and a P-well 906 are subsequently formed in silicon substrate 900. In some implementations, N-well 904 and P-well 906 are formed in regions for forming flat gate transistors. N-well 904 and P-well 906 can be patterned and aligned between isolation 902 using lithography, followed by ion implantation of respective N-type dopants and P-type dopants.

Figure 9B:
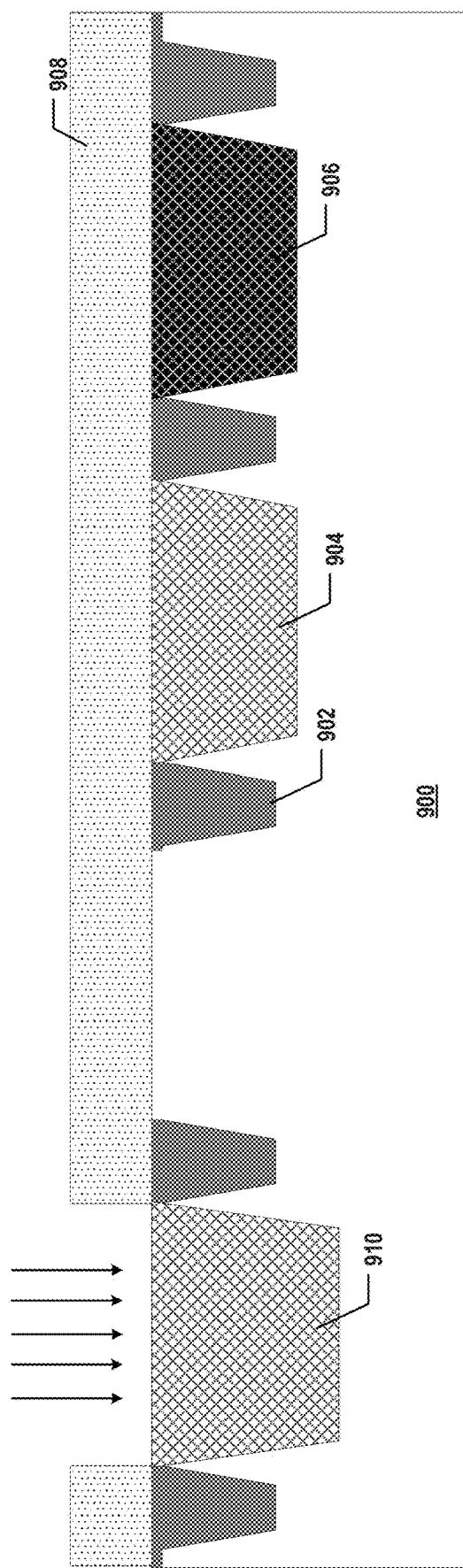

As shown in FIG. 11, at operation 1104, a second well is formed in the substrate. In some implementations, the depth of the second well is greater than the depth of the first well. As illustrated in FIG. 9B, an N-well 910 is formed in silicon substrate 900. N-well 910 may be part of a P-type recess gate transistor and thus, may be formed in a region for forming the P-type recess gate transistor. To form N-well 910, in some implementations, a mask layer 908 is formed on silicon substrate 900 and then patterned to expose the region in which N-well 910 is to be formed. Mask layer 908 can include a soft mask layer, such as a photoresist layer, and/or a hard mask layer, such as a silicon oxide layer. Mask layer 908 can be patterned and aligned between isolations 902 using lithography and wet/dry etch. Ion implantation of N-type dopants, such as P or As, can be performed with mask layer 908 to form N-well 910 into the desired region between isolations 902. In some implementations, the conditions of ion implantation for N-well 904, P-well 906, and N-well 910 are controlled, such that the depth of N-well 910 is greater than the depth of N-well 904 and P-well 906.

Figure 9C:
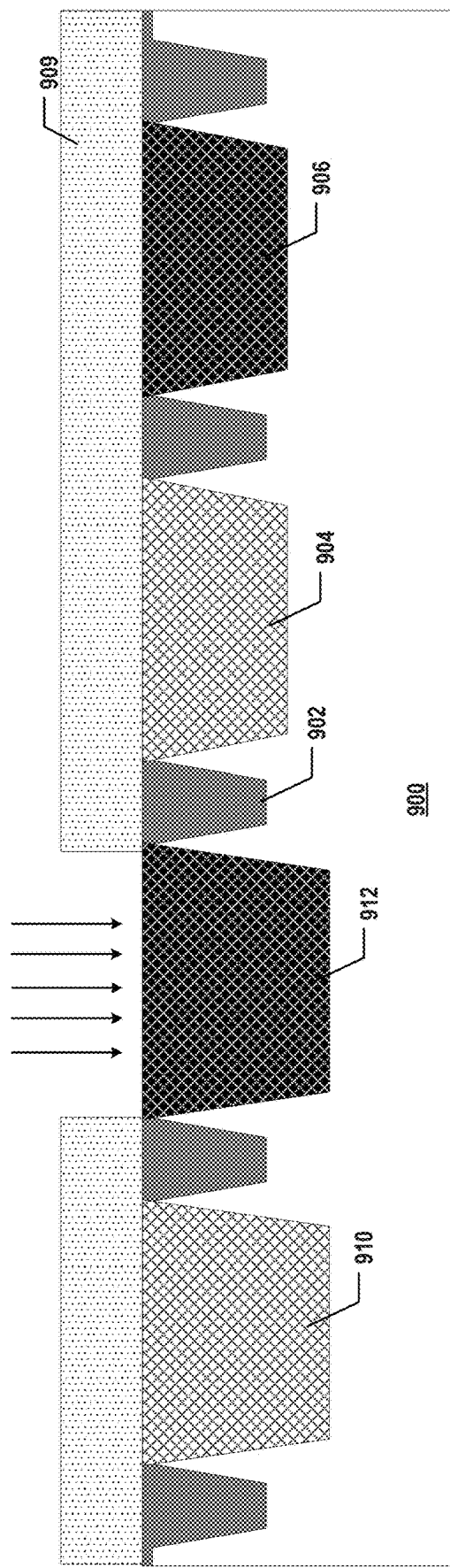

As illustrated in FIG. 9C, a P-well 912 is formed in silicon substrate 900. P-well 912 may be part of an N-type recess gate transistor and thus, may be formed in a region for forming the N-type recess gate transistor. To form P-well 912, in some implementations, a mask layer 909 is formed on silicon substrate 900 and then patterned to expose the region in which P-well 912 is to be formed. Mask layer 909 can include a soft mask layer, such as a photoresist layer, and/or a hard mask layer, such as a silicon oxide layer. Mask layer 909 can be patterned and aligned between isolations 902 using lithography and wet/dry etch. Ion implantation of P-type dopants, such as B or Ga, can be performed with mask layer 909 to form P-well 912 into the desired region between isolations 902. In some implementations, the conditions of ion implantation for N-well 904, P-well 906, and P-well 912 are controlled, such that the depth of P-well 912 is greater than the depth of N-well 904 and P-well 906.

Figure 9D:
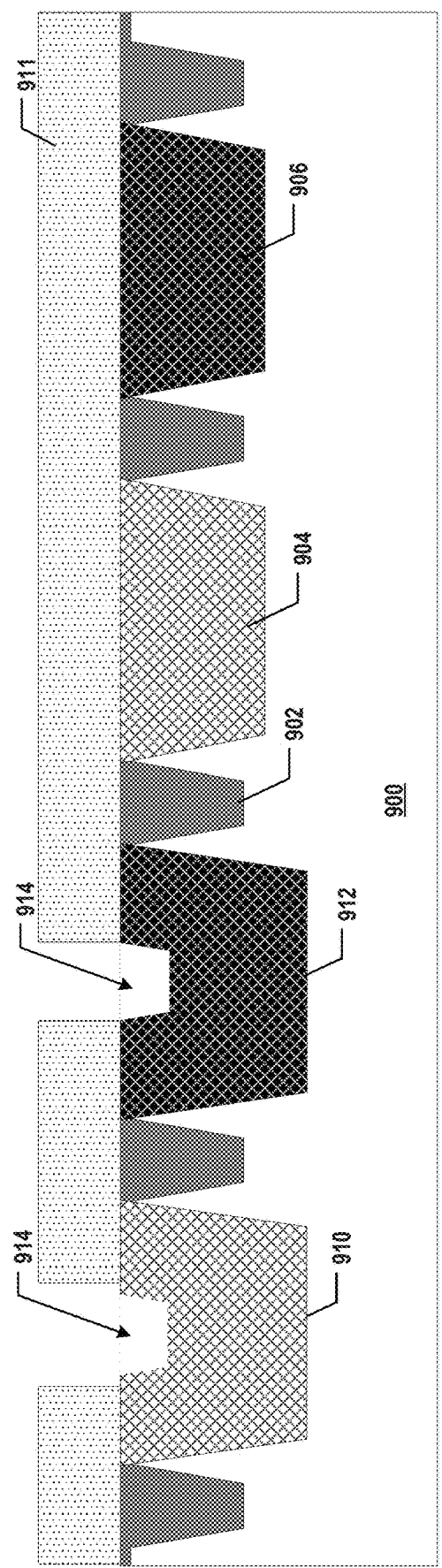

As shown in FIG. 11, at operation 1106, a recess is formed in the first well in the substrate, such that the recess is surrounded by the first well. In some implementations, the depth of the recess is between 50 nm and 100 nm. As illustrated in FIG. 9D, recesses 914 are formed in N-well 910 and P-well 912, respectively, for example, by the same etching process. In some implementations, a mask layer 911 is formed on silicon substrate 900 and then patterned to expose the regions in N-well 910 and P-well 912 in which recesses 914 are to be formed. Mask layer 911 can include a soft mask layer, such as a photoresist layer, and/or a hard mask layer, such as a silicon oxide layer. Mask layer 911 can be patterned using lithography and wet/dry etch. Etching of silicon substrate 900 can then be performed with mask layer 911 to form recesses 914 in wells 910 and 912. The etching process can include dry etching and/or wet etching. In some implementations, the etching process is a dry etching process, such as reactive ion etch (RIE). The etching conditions, such as etch rate and etch duration, can be controlled to control the depth of recess 914. In some implementations, the depth of recess 914 is between 50 nm and 100. As shown in FIG. 9D, recesses 914 are formed only in wells 910 and 912 of recess gate transistors, but not in wells 904 and 906 of flat gate transistors.

As shown in FIG. 11, at operation 1108, a bent gate dielectric on a sidewall and a bottom surface of the recess and a flat gate dielectric on the substrate are formed. In some implementations, to form the bent gate dielectric and the flat gate dielectric, a sacrificial dielectric layer is formed on the sidewall and the bottom surface of the recess, the sacrificial dielectric layer is removed, a gate dielectric layer is formed on the sidewall and the bottom surface of the recess, and the gate dielectric layer is patterned.

Figure 9E:
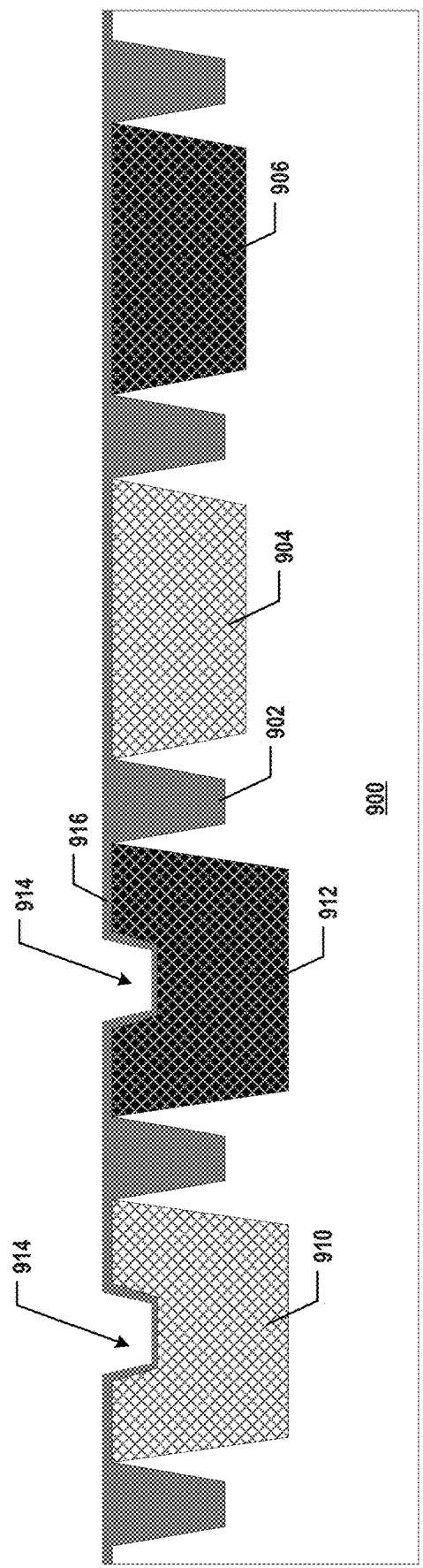
Figure 9F:
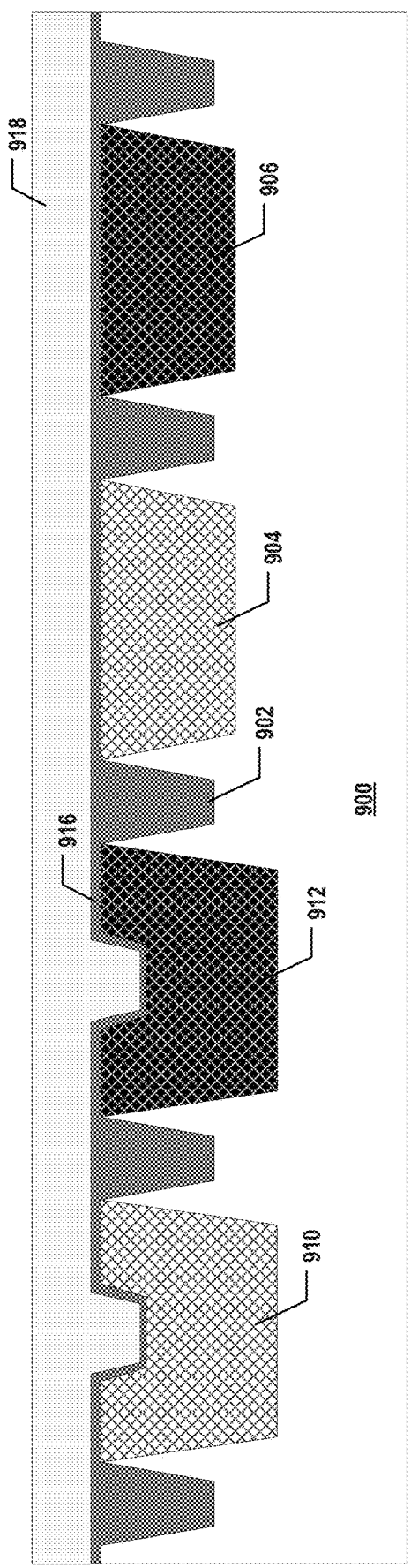
Figure 9G:
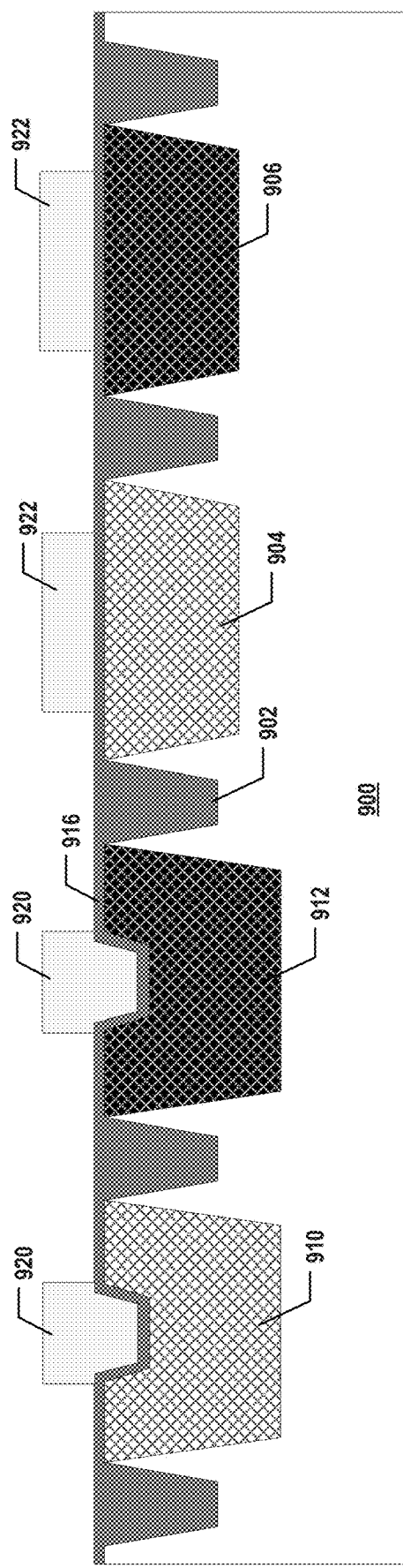
Figure 9H:
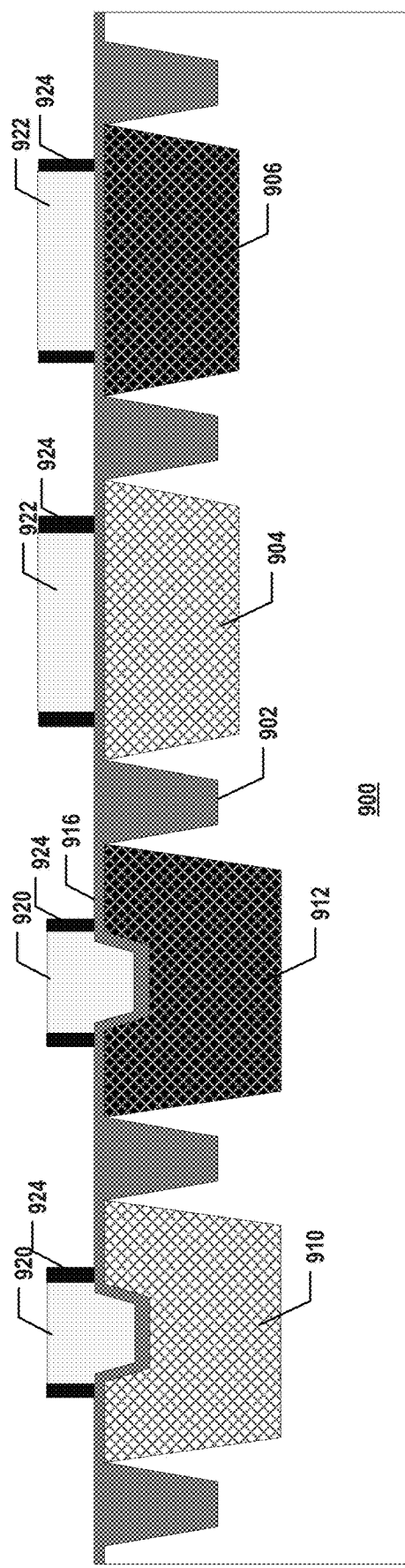
Figure 9I:
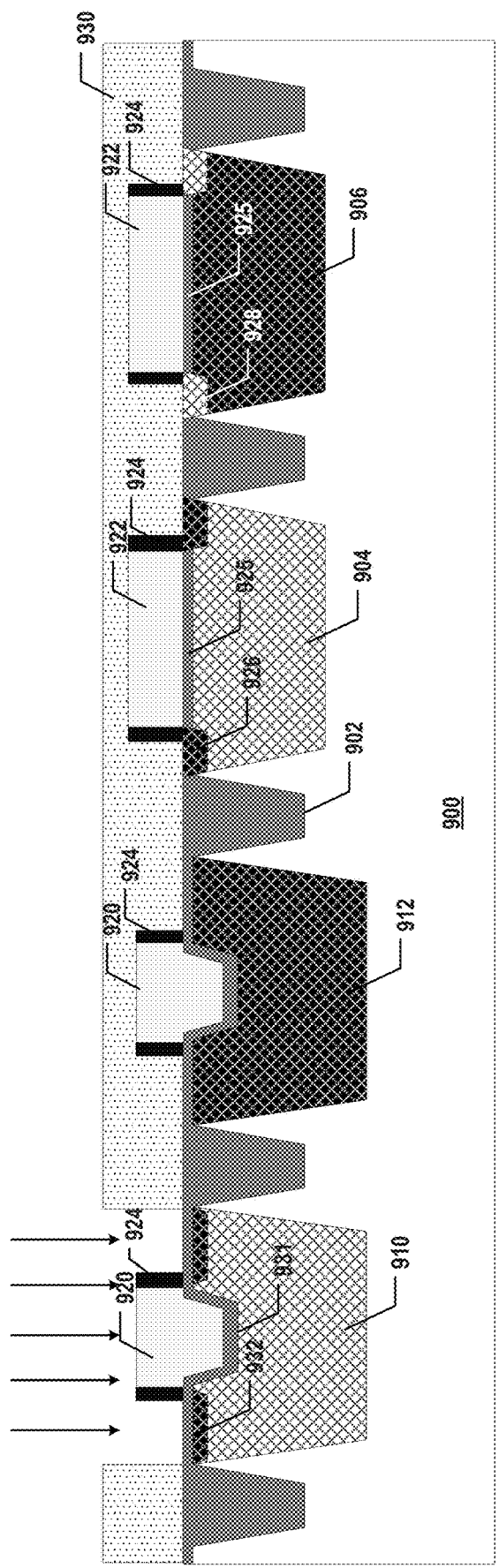
Figure 9J:
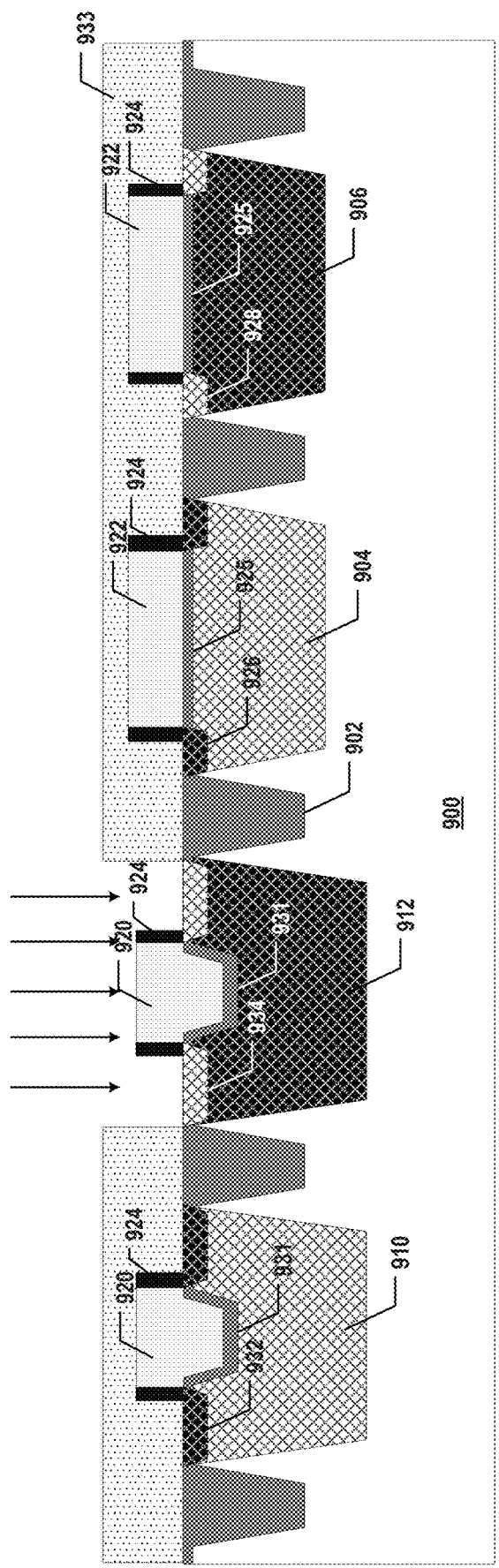

As illustrated in FIG. 9J, a bent gate dielectric 931 is formed on the sidewall and the bottom surface of each recess 914 (shown in FIG. 9D), and a flat gate dielectric 925 is formed on silicon substrate 900. To form bent gate dielectric 931 and flat gate dielectric 925, as shown in FIG. 9E, a gate dielectric layer 916 can be formed on the sidewall and the bottom surface of each recess 914 as well as on the top surface of silicon substrate 900 (e.g., wells 904 and 906) by the same deposition process. In some implementations, a layer of dielectric materials, such as silicon oxide, is deposited using one or more thin film deposition processes including, but not limited to, chemical vapor deposition (CVD), physical vapor deposition (PVD), atomic layer deposition (ALD), or any combination thereof. For example, a silicon oxide layer may be deposited using in situ steam generation (ISSG) to form gate dielectric layer 916. In some implementations, before forming gate dielectric layer 916, a sacrificial dielectric layer (not shown) is formed on the sidewall and the bottom surface of recess 914, for example, using thermal oxidation to remove the defects on the sidewall and the bottom surface of recess 914 caused by the etching process. The sacrificial dielectric layer can then be removed, for example, using wet etching, before forming gate dielectric layer 916. As shown in FIGS. 9I and 9J, gate dielectric layer 916 can be patterned to form flat gate dielectric 925 and bent gate dielectric 931 using lithography and etching processes in subsequent steps or the same step.

As shown in FIG. 11, at operation 1110, a recess gate electrode on the bent gate dielectric and a flat gate electrode on the flat gate dielectric are formed. In some implementations, to form the recess gate electrode and the flat gate electrode, a gate electrode layer is formed on the bent gate dielectric to fill the recess, the gate electrode layer is planarized, and the planarized gate electrode layer is patterned.

As illustrated in FIG. 9J, a recess gate electrode 920 is formed on bent gate dielectric 931, and a flat gate electrode 922 is formed on flat gate dielectric 925. To form recess gate electrode 920 and flat gate electrode 922, as shown in FIG. 9F, a gate electrode layer 918 is formed on gate dielectric layer 916. Recesses 914 (shown in FIG. 9E) can be filled by gate electrode layer 918. In some implementations, a layer of conductive materials, such as polysilicon, is deposited gate dielectric layer 916 using one or more thin film deposition processes including, but not limited to, CVD, PVD, ALD, or any combination thereof. Depending on the surface flatness of gate electrode layer 918 affected by the depth of recess 914, a planarization process, such as chemical mechanical polishing (CMP) may be performed to planarize the top surface of gate electrode layer 918. As shown in FIG. 9G, recess gate electrode 920 and flat gate electrode 922 are formed by patterning gate electrode layer 918 using lithography and etching processes in the same step.

As shown in FIG. 11, at operation 1112, spacers on sidewalls of the flat gate electrode and on sidewalls of the recess gate electrode that are above the substrate are formed. As illustrated in FIG. 9H, spacers 924 are formed on the sidewalls of flat gate electrode 922 as well as on the sidewalls of part of recess gate electrode 920 that is above silicon substrate 900. In some implementations, to form spacers 924, a layer of dielectric material (not shown), such as silicon nitride, is deposited on the sidewalls and the top surfaces of recess gate electrodes 920 and flat gate electrodes 922 as well as on gate dielectric layer 916 using one or more thin film deposition processes including, but not limited to, CVD, PVD, ALD, or any combination thereof. The deposited layer of dielectric material can then be patterned using lithography and etching processes in the same step to remove parts on the top surfaces of recess gate electrodes 920, flat gate electrodes 922, and gate dielectric layer 916, leaving parts on the sidewalls of recess gate electrodes 920 and flat gate electrodes 922 to form spacers 924.

As shown in FIG. 11, at operation 1114, a first source and a first drain in the first well and spaced apart by the bent gate dielectric and the recess gate electrode are formed. As illustrated in FIG. 9I, a P-type source 932 and a P-type drain 932 are formed in N-well 910 and are spaced apart by bent gate dielectric 931 and recess gate electrode 920. To form P-type source and drain 932, in some implementations, a mask layer 930 is formed on silicon substrate 900 and then patterned to expose the region in which P-type source and drain 932 are to be formed. Mask layer 930 can include a soft mask layer, such as a photoresist layer, and/or a hard mask layer, such as a silicon oxide layer. Mask layer 930 can be patterned and aligned with N-well 910 using lithography and wet/dry etch. Ion implantation of P-type dopants, such as B or Ga, can be performed with mask layer 930 to form P-type source and drain 932 into N-well 910 and spaced apart by bent gate dielectric 931 and recess gate electrode 920.

As shown in FIG. 11, at operation 1116, a second source and a second drain are formed in the second well. As illustrated in FIG. 9J, an N-type source 934 and an N-type drain 934 are formed in P-well 912 and are spaced apart by bent gate dielectric 931 and recess gate electrode 920. To form N-type source and drain 934, in some implementations, a mask layer 933 is formed on silicon substrate 900 and then patterned to expose the region in which N-type source and drain 934 are to be formed. Mask layer 933 can include a soft mask layer, such as a photoresist layer, and/or a hard mask layer, such as a silicon oxide layer. Mask layer 933 can be patterned and aligned with P-well 912 using lithography and wet/dry etch. Ion implantation of N-type dopants, such as P or As, can be performed with mask layer 933 to form N-type source and drain 934 into P-well 912 and spaced apart by bent gate dielectric 931 and recess gate electrode 920.

As illustrated in FIG. 9I, P-type source and drain 926 and N-type source and drain 928 are subsequently formed in N-well 904 and P-well 906 of flat gate transistors, respectively, using lithography, followed by ion implantation of respective P-type dopants and N-type dopants. In some implementations, the conditions of ion implantation for P-type source and drain 926, N-type source and drain 928, P-type source and drain 932, and N-type source and drain 934 such doping concentration of P-type source and drain 932, and N-type source and drain 934 of recess gate transistors are different from P-type source and drain 926, and N-type source and drain 928 of flat recess gate transistors.

In some implementations, to form the second semiconductor structure including the recess gate transistor, the recess gate transistor is formed in a first device layer, and a flat gate transistor is formed in a second device layer. The first device layer and the second device layer can be stacked over one another, i.e., formed in different planes. For example, as illustrated in FIG. 8C, recess gate transistors 872 are formed in semiconductor layer 870 (e.g., the second substrate), and flat gate transistors 876 are formed on semiconductor layer 874 above recess gate transistors 872.

Referring to FIG. 10, method 1000 proceeds to operation 1008 in which a second bonding layer including a plurality of second bonding contacts is formed above the recess gate transistor. For example, as illustrated in FIG. 8B, bonding layer 851 including bonding contacts 853 is formed above array of recess gate transistor 839. Method 1000 proceeds to operation 1010, as illustrated in FIG. 10, in which the first semiconductor structure and the second semiconductor structure are bonded in a face-to-face manner, such that the array of NAND memory strings is coupled to the recess gate transistor across a bonding interface. The bonding can be hybrid bonding. In some implementations, the second semiconductor structure is above the first semiconductor structure after the bonding. In some implementations, the first semiconductor structure is above the second semiconductor structure after the bonding.

As illustrated in FIG. 8A, second semiconductor structure 804 having NAND memory strings 838 is flipped upside down. Bonding layer 826 facing down is bonded with bonding layer 822 facing up, i.e., in a face-to-face manner, thereby forming a bonding interface 806. In some implementations, a treatment process, e.g., a plasma treatment, a wet treatment, and/or a thermal treatment, is applied to the bonding surfaces prior to the bonding. After the bonding, bonding contacts 828 in bonding layer 826 and bonding contacts 824 in bonding layer 822 are aligned and in contact with one another, such that NAND memory strings 838 can be coupled to device layer 810 (e.g., peripheral circuits 812 and 814). Similarly, as illustrated in FIG. 8B, first semiconductor structure 805 having peripheral circuits 835 and 837 is flipped upside down. Bonding layer 851 facing down is bonded with bonding layer 829 facing up, i.e., in a face-to-face manner, thereby forming a bonding interface 807. After the bonding, bonding contacts 853 in bonding layer 851 and bonding contacts 855 in bonding layer 829 are aligned and in contact with one another, such that NAND memory strings 817 can be coupled to device layer 831 (e.g., peripheral circuits 835 and 837).

Method 1000 proceeds to operation 1012, as illustrated in FIG. 10, in which one of the first and second substrates that is above another one of the first and second substrates after the bonding is thinned. As illustrated in FIG. 8A, as the substrate of second semiconductor structure 804 having NAND memory strings 838 is above the substrate of first semiconductor structure 802 having peripheral circuits 812 and 814, the substrate of second semiconductor structure 804 is thinned to form semiconductor layer 848 using CMP and/or etching processes. Similarly, as illustrated in FIG. 8B, as the substrate of first semiconductor structure 805 having peripheral circuits 835 and 837 is above the substrate of second semiconductor structure 803 having NAND memory strings 817, the substrate of first semiconductor structure 805 is thinned to form semiconductor layer 833 using CMP and/or etching processes.

Method 1000 proceeds to operation 1014, as illustrated in FIG. 14, in which an interconnect layer is formed on the thinned first or second substrate. As illustrated in FIG. 8A, pad-out interconnect layer 850 is formed above semiconductor layer 848 (the thinned top substrate). Similarly, as illustrated in FIG. 8B, pad-out interconnect layer 843 is formed above semiconductor layer 833 (the thinned top substrate).

According to one aspect of the present disclosure, a method for forming a 3D memory device is disclosed. A first semiconductor structure including an array of NAND memory strings is formed on a first substrate. A second semiconductor structure including a recess gate transistor is formed on a second substrate. The recess gate transistor includes a recess gate structure protruding into the second substrate. The first semiconductor structure and the second semiconductor structure are bonded in a face-to-face manner, such that the array of NAND memory strings is coupled to the recess gate transistor across a bonding interface.

In some implementations, to form the second semiconductor structure, a recess is formed in the second substrate, a gate dielectric is formed on a sidewall and a bottom surface of the recess, and a gate electrode is formed on the gate dielectric.

In some implementations, to form the second semiconductor structure, a well is formed in the second substrate such that the recess is in the well, and a source and a drain spaced apart by the recess gate structure is formed.

In some implementations, to form the first semiconductor structure, a first bonding layer including a plurality of first bonding contacts is formed above the array of NAND memory strings. In some implementations, to form the second semiconductor structure, a second bonding layer including a plurality of second bonding contacts is formed above the recess gate transistor. In some implementations, the first bonding contacts are in contact with the second bonding contacts at the bonding interface after the bonding.

In some implementations, one of the first and second substrates that is above another one of the first and second substrates is thinned after the bonding, and an interconnect layer is formed on the thinned first or second substrate.

In some implementations, the bonding includes hybrid bonding.

In some implementations, to form the second semiconductor structure, the recess gate transistor and a flat gate transistor are formed on the second substrate.

In some implementations, to form the second semiconductor structure, the recess gate transistor is formed in a first device layer, and a flat gate transistor is formed in a second device layer.

In some implementations, the first device layer and the second device layer are stacked over one another.

In some implementations, to form the second semiconductor structure, the recess gate transistor is formed on the second substrate, and to form the first semiconductor structure, a flat gate transistor is formed in a device layer.

In some implementations, the device layer and the array of NAND memory strings are stacked over one another.

According to another aspect of the present disclosure, a method for forming a semiconductor device is disclosed. A recess is formed in a substrate. A first gate dielectric is formed on a sidewall and a bottom surface of the recess and a second gate dielectric on the substrate. A first gate electrode is formed on the first gate dielectric and a second gate electrode on the second gate dielectric.

In some implementations, a depth of the recess is between 50 nm and 100 nm.

In some implementations, a first well and a second well are formed in the substrate such that the recess is in the first well, and the second gate dielectric is on the second well, a first source and a first drain are formed in the first well and spaced apart by the first gate dielectric and the first gate electrode, and a second source and a second drain are formed in the second well.

In some implementations, each of the first source, the first drain, the second source, and the second drain is doped.

In some implementations a doping concentration of the first source and drain is different from a doping concentration of the second source and drain.

In some implementations, a depth of the first well is greater than a depth of the second well.

In some implementations, to form the first gate dielectric and the second gate dielectric, a sacrificial dielectric layer is formed on the sidewall and the bottom surface of the recess, the sacrificial dielectric layer is removed, a gate dielectric layer is formed on the sidewall and the bottom surface of the recess, and the gate dielectric layer is patterned.

In some implementations, to form the first gate electrode and the second gate electrode, a gate electrode layer is formed on the gate dielectric layer to fill the recess, the gate electrode layer is planarized, and the planarized gate electrode layer is patterned.

In some implementations, spacers are formed on sidewalls of the second gate electrode and on sidewalls of the first gate electrode that are above the substrate.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a three-dimensional (3D) memory device, comprising:
   forming, on a first substrate, a first semiconductor structure comprising an array of NAND memory strings;
   forming, on a second substrate, a second semiconductor structure comprising a recess gate transistor and a flat gate transistor, the recess gate transistor comprising a recess gate structure protruding into the second substrate, and a gate length of the flat gate transistor being greater than a gate length of the recess gate transistor in a plan view; and
   bonding the first semiconductor structure and the second semiconductor structure in a face-to-face manner, such that the array of NAND memory strings is coupled to the recess gate transistor across a bonding interface.

2. The method of claim 1, wherein forming the second semiconductor structure comprises:
   forming a recess in the second substrate;
   forming a gate dielectric on a sidewall and a bottom surface of the recess; and
   forming a gate electrode on the gate dielectric.

3. The method of claim 2, wherein forming the second semiconductor structure further comprises:
   forming a well in the second substrate such that the recess is in the well; and
   forming a source and a drain spaced apart by the recess gate structure.

4. The method of claim 2, wherein a depth of the recess is between 50 nm and 100 nm.

5. The method of claim 1, wherein
   forming the first semiconductor structure comprises forming a first bonding layer comprising a plurality of first bonding contacts above the array of NAND memory strings;
   forming the second semiconductor structure comprises forming a second bonding layer comprising a plurality of second bonding contacts above the recess gate transistor; and
   the first bonding contacts are in contact with the second bonding contacts at the bonding interface after the bonding.

6. The method of claim 1, further comprising:
   thinning one of the first and second substrates that is above another one of the first and second substrates after the bonding; and
   forming an interconnect layer on the thinned first or second substrate.

7. The method of claim 1, wherein the bonding comprises hybrid bonding.

8. The method of claim 1, wherein forming the second semiconductor structure comprises forming the recess gate transistor and the flat gate transistor on the second substrate.

9. The method of claim 1, wherein forming the second semiconductor structure comprises:
   forming the recess gate transistor in a first device layer; and
   forming the flat gate transistor in a second device layer.

10. The method of claim 9, wherein the first device layer and the second device layer are stacked over one another.

11. The method of claim 1, wherein
   forming the second semiconductor structure comprises forming the recess gate transistor on a well in the second substrate.

12. The method of claim 1, wherein
   forming the second semiconductor structure comprising forming the recess gate transistor on a first well in the second substrate and forming the flat gate transistor on a second well in the second substrate; and
   a depth of the first well is greater than a depth of the second well.

13. The method of claim 12, further comprising:
   doping a region of the first well with a first doping concentration to form a first source and a first drain of the recess gate transistor; and doping a region of the second well with a second doping concentration to form a second source and a second drain of the flat gate transistor, the first doping concentration being different from the second doping concentration.

14. The method of claim 1, wherein
the recess gate structure, protruding into the second substrate, comprises a first gate dielectric; and
the flat gate transistor comprises a flat gate structure that comprises a second gate dielectric having a material identical to a material of the first gate dielectric.

15. The method of claim 14, wherein
the first gate dielectric of the recess gate transistor and the second gate dielectric of the flat gate transistor are formed simultaneously.

16. The method of claim 1, further comprising:
forming an isolation structure, in the second substrate, between the recess gate transistor and the flat gate transistor, the isolation structure comprising a dielectric material.

17. A method for forming a three-dimensional (3D) memory device, comprising:
forming, on a first substrate, a first semiconductor structure comprising a flat gate transistor and an array of NAND memory strings;
forming, on a second substrate, a second semiconductor structure comprising a recess gate transistor, the recess gate transistor comprising a recess gate structure protruding into the second substrate; and
bonding the first semiconductor structure with the second semiconductor structure in a face-to-face manner, the array of NAND memory strings being coupled to the recess gate transistor,
wherein a gate length of the flat gate transistor is greater than a gate length of the recess gate transistor in a plan view.

18. The method of claim 17, wherein
forming the flat gate transistor comprising forming the flat gate transistor in a device layer of the first semiconductor structure.

19. The method of claim 18, wherein
the device layer and the array of NAND memory strings are stacked over one another.

20. The method of claim 18, wherein
the array of the NAND memory strings in the first semiconductor structure is coupled to the recess gate transistor in the second semiconductor structure through the device layer in which the flat gate transistor is arranged.

* * * * *